United States Patent
Huang

(10) Patent No.: US 12,094,833 B2
(45) Date of Patent: Sep. 17, 2024

(54) SEMICONDUCTOR DEVICE WITH ALIGNMENT MARKS AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 446 days.

(21) Appl. No.: 17/676,999

(22) Filed: Feb. 22, 2022

(65) Prior Publication Data

US 2023/0268283 A1    Aug. 24, 2023

(51) Int. Cl.
*H01L 23/544* (2006.01)
*H01L 21/68* (2006.01)

(52) U.S. Cl.
CPC ............ *H01L 23/544* (2013.01); *H01L 21/68* (2013.01); *H01L 2223/54426* (2013.01)

(58) Field of Classification Search
CPC .................. H01L 21/68; H01L 23/544; H01L 2223/54426
See application file for complete search history.

(56) References Cited

U.S. PATENT DOCUMENTS

2012/0015464 A1    1/2012   Chien et al.
2023/0178494 A1*   6/2023   Shih ........................ G03F 9/708

FOREIGN PATENT DOCUMENTS

EP         1596441 A2      11/2005
TW         202138595 A     10/2021
WO      WO2019186901 A1    10/2019

OTHER PUBLICATIONS

Notice of Allowance dated on Mar. 6, 2023 related to Taiwanese Application No. 111117520.
Notice of Allowance dated on May 10, 2023 related to Taiwanese Application No. 111117521.
Summary translation of Notice of Allowance dated on Mar. 6, 2023 related to Taiwanese Application No. 111117520 and Notice of Allowance dated on May 10, 2023 related to Taiwanese Application No. 111117521.

* cited by examiner

*Primary Examiner* — Daniel P Shook
(74) *Attorney, Agent, or Firm* — Xuan Zhang

(57) ABSTRACT

The present application discloses a semiconductor device and a method for fabricating the semiconductor device. The semiconductor device includes a first subset of solid alignment marks positioned over a substrate and including: a first-layer-alignment mark positioned on the substrate, and a second-layer-alignment mark positioned above and deviated from the first-layer-alignment mark of the first subset of solid alignment marks; and a first subset of spaced alignment marks positioned over the substrate, distant from the first subset of solid alignment marks, and including: a first-layer-alignment mark positioned on the substrate and distant from the first-layer-alignment mark of the first subset of solid alignment marks, and a second-layer-alignment mark positioned above and deviated from the first-layer-alignment mark of the first subset of spaced alignment marks. The first subset of solid alignment marks and the first subset of spaced alignment marks include a fluorescence material.

17 Claims, 34 Drawing Sheets

SEMICONDUCTOR DEVICE WITH ALIGNMENT MARKS AND METHOD FOR FABRICATING THE SAME

TECHNICAL FIELD

The present disclosure relates to a semiconductor device and a method for fabricating the semiconductor device, and more particularly, to a semiconductor device with alignment marks and a method for fabricating the semiconductor device the alignment marks.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first subset of solid alignment marks positioned over a substrate and including: a first-layer-alignment mark of the first subset of solid alignment marks positioned on the substrate, and a second-layer-alignment mark of the first subset of solid alignment marks positioned above and deviated from the first-layer-alignment mark of the first subset of solid alignment marks; and a first subset of spaced alignment marks positioned over the substrate, distant from the first subset of solid alignment marks, and including: a first-layer-alignment mark of the first subset of spaced alignment marks positioned on the substrate and distant from the first-layer-alignment mark of the first subset of solid alignment marks, and a second-layer-alignment mark of the first subset of spaced alignment marks positioned above and deviated from the first-layer-alignment mark of the first subset of spaced alignment marks. The first subset of solid alignment marks and the first subset of spaced alignment marks include a fluorescence material.

Another aspect of the present disclosure provides a semiconductor device including a first conductive layer positioned on a substrate and a second conductive layer positioned on the first insulating layer; a first subset of solid alignment marks including: a first-layer-alignment mark of the first subset of solid alignment marks positioned in the first conductive layer, and a second-layer-alignment mark of the first subset of solid alignment marks positioned in the second conductive layer and deviated from the first-layer-alignment mark of the first subset of solid alignment marks; and a first subset of spaced alignment marks including: a first-layer-alignment mark of the first subset of spaced alignment marks positioned in the first conductive layer and distant from the first-layer-alignment mark of the first subset of solid alignment marks, a second-layer-alignment mark of the first subset of spaced alignment marks positioned in the second conductive layer and deviated from the first-layer-alignment mark of the first subset of spaced alignment marks. The first subset of solid alignment marks and the first subset of spaced alignment marks include a fluorescence material.

Another aspect of the present disclosure provides a method for fabricating a semiconductor device including providing a substrate; and forming a first subset of solid alignment marks and a first subset of spaced alignment marks over the substrate and distant from each other. The first subset of solid alignment marks includes a first-layer-alignment mark of the first subset of solid alignment marks formed on the substrate, and a second-layer-alignment mark of the first subset of solid alignment marks formed above and deviated from the first-layer-alignment mark of the first subset of solid alignment marks. The first subset of spaced alignment marks includes a first-layer-alignment mark of the first subset of spaced alignment marks formed on the substrate and distant from the first-layer-alignment mark of the first subset of solid alignment marks, and a second-layer-alignment mark of the first subset of spaced alignment marks formed above and deviated from the first-layer-alignment mark of the first subset of spaced alignment marks. The first subset of solid alignment marks and the first subset of spaced alignment marks include a fluorescence material.

Due to the design of the semiconductor device of the present disclosure, the alignment marks 111, 113, 115, 117, 121, 123, 125, 127, 131, 133, 135, 137, 141, 143, 145, 147, 211, 213, 215, 217, 221, 223, 225, 227, 231, 233, 235, 237, 241, 243, 245, 247 including the fluorescence material may improve optical recognition during wafer fabrication process. As a result, the yield of fabricating the semiconductor device 1A may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
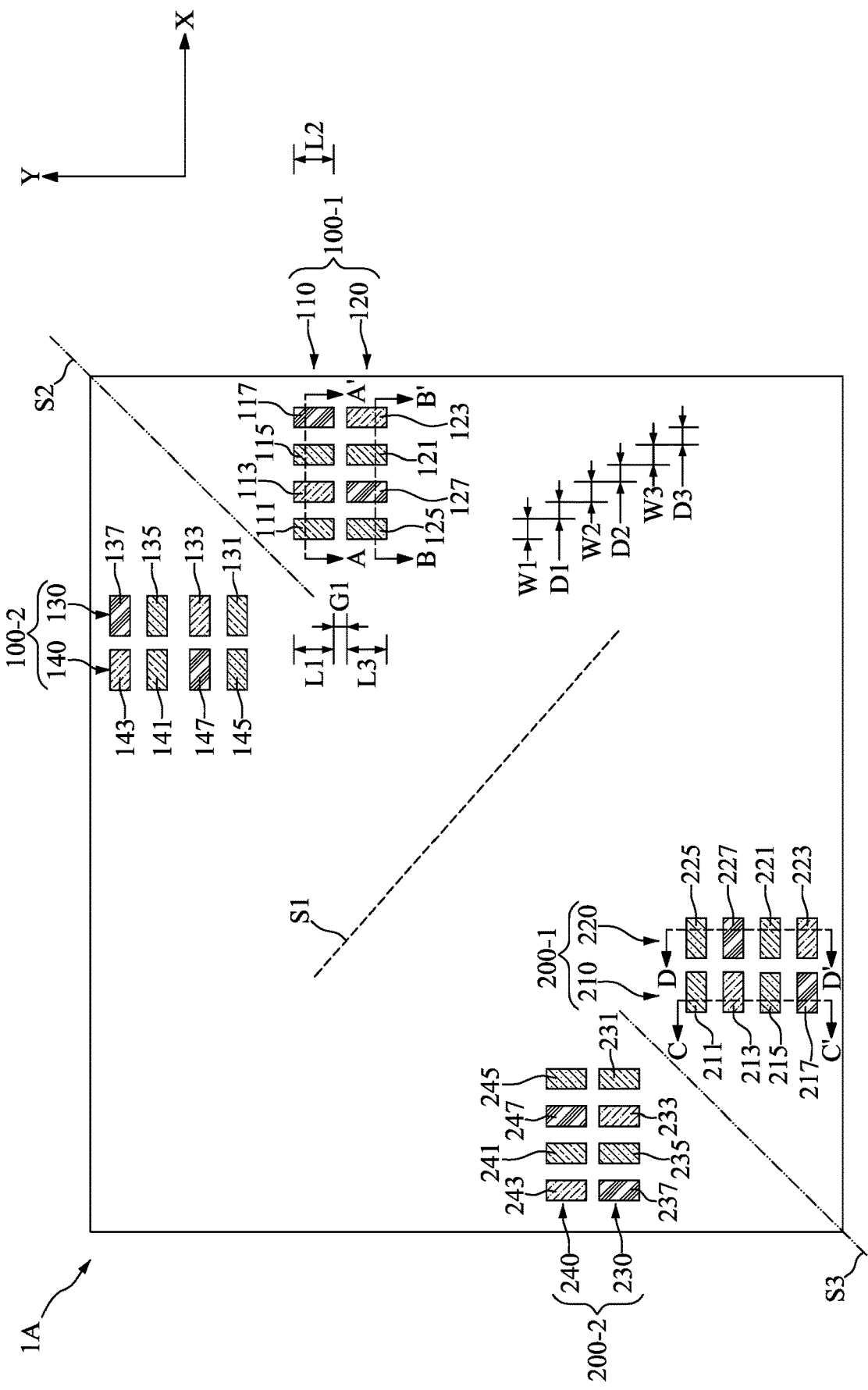
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

Figure 2:
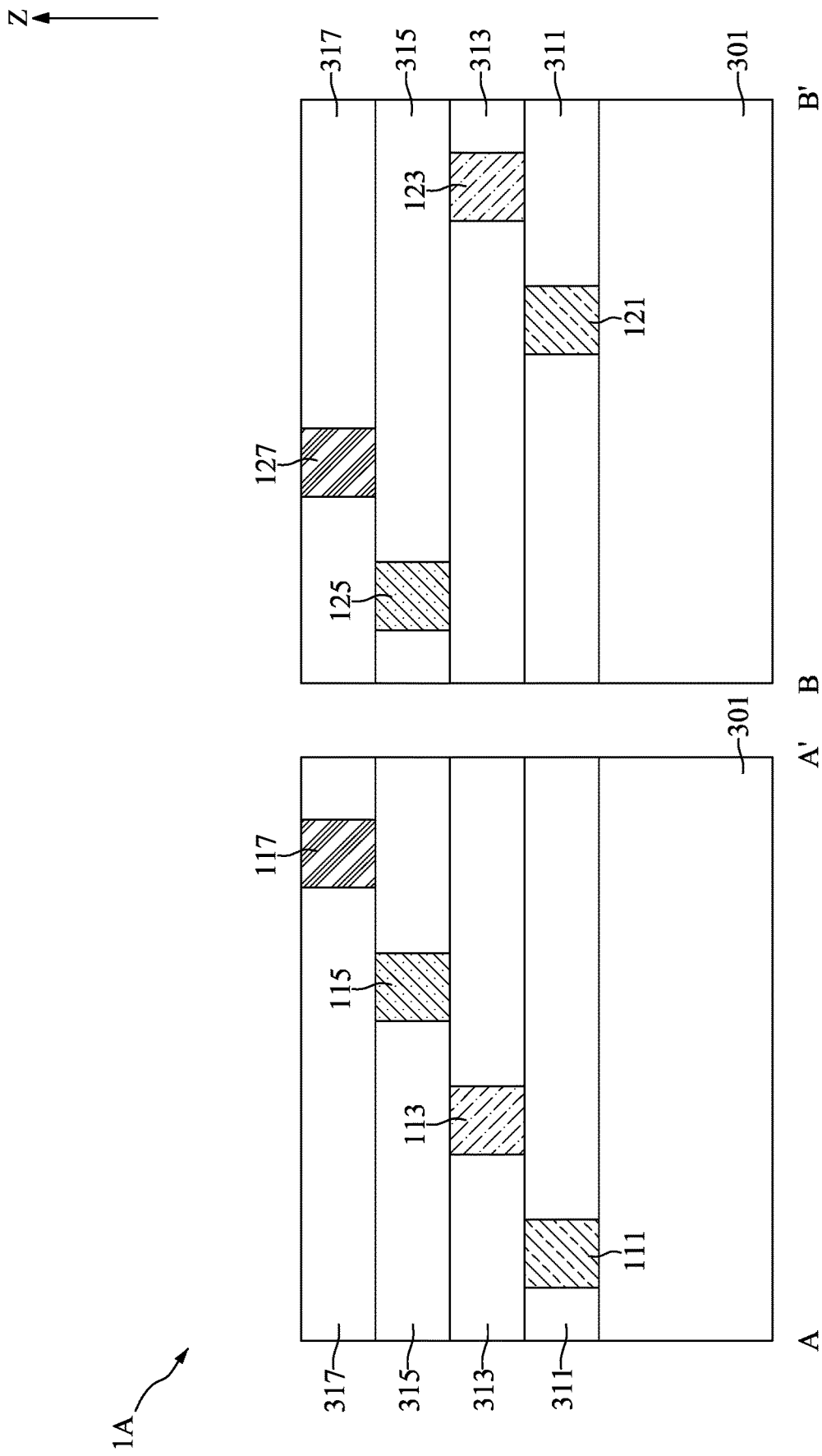
FIGS. 2 and 3 are schematic cross-sectional view diagrams taken along lines A-A', B-B', C-C', and D-D' in FIG. 1.
Figure 3:
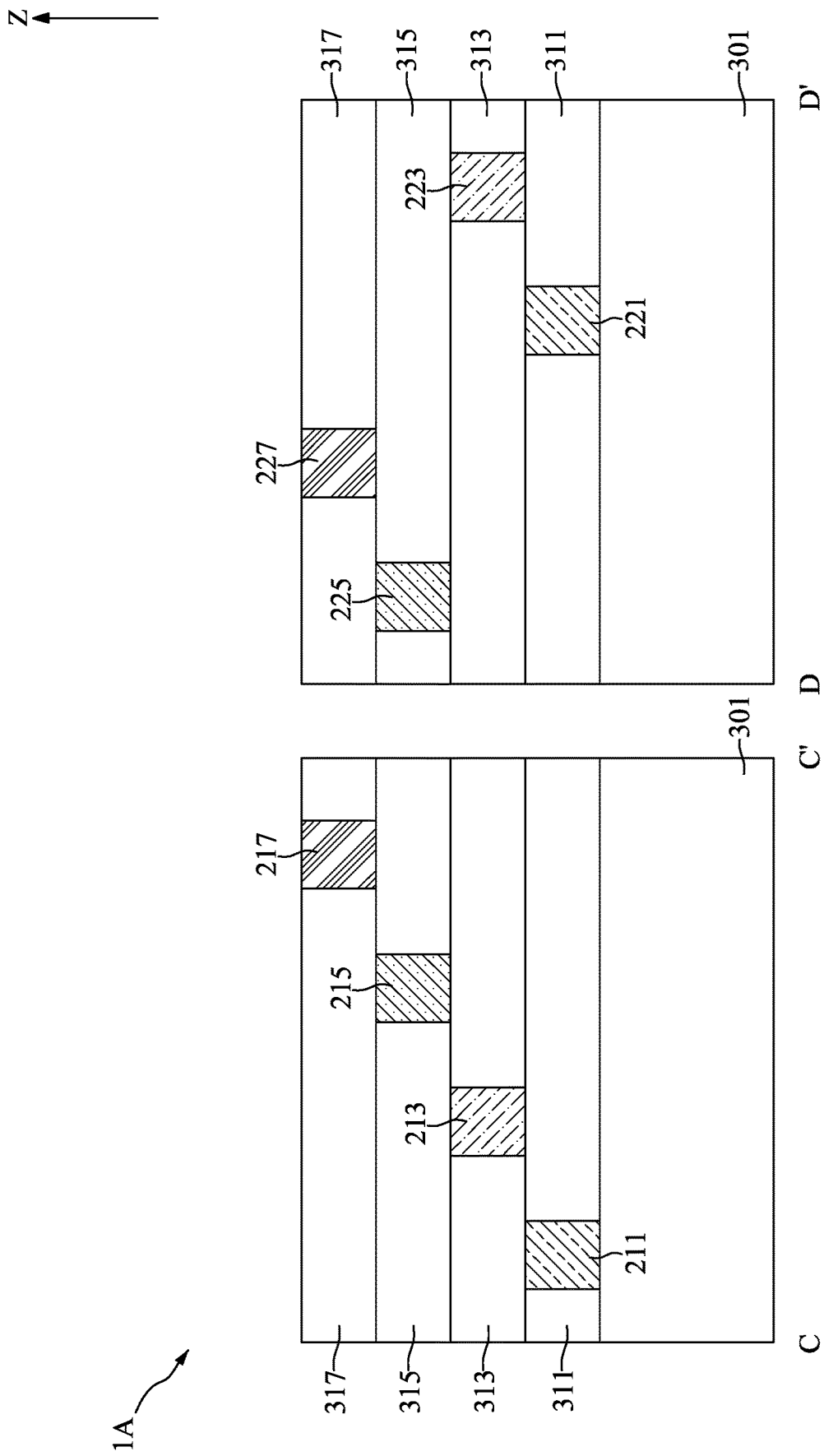

FIG. 1 illustrates, in a schematic top-view diagram, a semiconductor device 1A in accordance with one embodiment of the present disclosure. FIG. 2 is a schematic cross-sectional view diagram taken along lines A-A' and B-B' in FIG. 1. FIG. 3 is a schematic cross-sectional view diagram taken along lines C-C' and D-D' in FIG. 1.

With reference to FIGS. 1 to 3, the semiconductor device 1A may include a substrate 301, a first insulating layer 311, a second insulating layer 313, a third insulating layer 315, a fourth insulating layer 317, a first set of solid alignment marks 100-1, a second set of solid alignment marks 100-2, a first set of spaced alignment marks 200-1, and a second set of spaced alignment marks 200-2.

With reference to FIGS. 1 to 3, the substrate 301 may include a bulk semiconductor substrate that is composed entirely of at least one semiconductor material, a plurality of device elements (not show for clarity), a plurality of dielectric layers (not shown for clarity), and a plurality of conductive features (not show for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof. In some embodiments, the substrate 301 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride.

The plurality of dielectric layers may be formed on the bulk semiconductor substrate or the topmost semiconductor material layer and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0.

The plurality of conductive features may include interconnect layers and conductive vias. The interconnect layers may be separated from each other and may be horizontally disposed in the plurality of dielectric layers along a direction Z. The conductive vias may connect adjacent interconnect layers along the direction Z, and adjacent device element and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, the plurality of device elements and the plurality of conductive features may together configure functional units in the substrate 301. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIGS. 1 to 3, the first insulating layer 311 may be disposed on the substrate 301, the second insulating layer 313 may be disposed on the first insulating layer 311, the third insulating layer 315 may be disposed on the second insulating layer 313, and the fourth insulating layer 317 may be disposed on the third insulating layer 315. The first insulating layer 311, the second insulating layer 313, the third insulating layer 315, the fourth insulating layer 317 may be formed of for example, silicon oxide, borophosphosilicate glass, undoped silicate glass, fluorinated silicate glass, low-k dielectric materials, the like, or a combination thereof. In some embodiments, the first insulating layer 311, the second insulating layer 313, the third insulating layer 315, and the fourth insulating layer 317 may be part of the plurality of dielectric layers of the substrate 301.

With reference to FIGS. 1 to 3, the first set of solid alignment marks 100-1 may include a first subset of solid alignment marks 110 and a second subset of solid alignment marks 120. The first subset of solid alignment marks 110 may include a first-layer-alignment mark 111, a second-layer-alignment mark 113, a third-layer-alignment mark 115, and a fourth-layer-alignment mark 117.

With reference to FIGS. 1 to 3, in some embodiments, the first-layer-alignment mark 111 may be line shaped in a top-view perspective. The first-layer-alignment mark 111 may extend along the direction Y. The first-layer-alignment mark 111 may be disposed in the first insulating layer 311 and on the substrate 301.

In a cross-sectional perspective, the second-layer-alignment mark 113 may be disposed in the second insulating layer 313 and may be deviated from the first-layer-alignment mark 111. In other words, the second-layer-alignment mark 113 may not be directly above the first-layer-alignment mark 111. In a top-view perspective, the second-layer-alignment mark 113 may be line shaped. The second-layer-alignment mark 113 may extend along the direction Y and may be separated from the first-layer-alignment mark 111 along the direction X.

In a cross-sectional perspective, the third-layer-alignment mark 115 may be disposed in the third insulating layer 315 and may be deviated from the second-layer-alignment mark 113. In other words, the third-layer-alignment mark 115 may not be directly above the second-layer-alignment mark 113. In a top-view perspective, the third-layer-alignment mark 115 may be line shaped. The third-layer-alignment mark 115 may extend along the direction Y and may be separated from the second-layer-alignment mark 113 along the direction X. The second-layer-alignment mark 113 may be disposed between the first-layer-alignment mark 111 and the third-layer-alignment mark 115.

In a cross-sectional perspective, the fourth-layer-alignment mark 117 may be disposed in the fourth insulating layer 317 and may be deviated from the third-layer-alignment mark 115. In other words, the fourth-layer-alignment mark 117 may not be directly above the third-layer-alignment mark 115. In a top-view perspective, the fourth-layer-alignment mark 117 may be line shaped. The fourth-layer-alignment mark 117 may extend along the direction Y and may be separated from the third-layer-alignment mark 115 along the direction X. The third-layer-alignment mark 115 may be disposed between the second-layer-alignment mark 113 and the fourth-layer-alignment mark 117.

In some embodiments, the first-layer-alignment mark 111, the second-layer-alignment mark 113, the third-layer-alignment mark 115, and the fourth-layer-alignment mark 117 may be aligned to each other along the direction Y. In some embodiments, the first-layer-alignment mark 111, the second-layer-alignment mark 113, the third-layer-alignment mark 115, and the fourth-layer-alignment mark 117 may not be aligned to each other along the direction Y.

In some embodiments, in a top-view perspective, the length L1 of the first-layer-alignment mark 111 and the width W1 of the first-layer-alignment mark 111 may be different. For example, the length L1 of the first-layeralignment mark 111 may be greater than the width W1 of the first-layer-alignment mark 111. In some embodiments, the length L1 of the first-layer-alignment mark 111 and the width W1 of the first-layer-alignment mark 111 may be substantially the same.

In some embodiments, the lengths of the second-layer-alignment mark 113, the third-layer-alignment mark 115, the fourth-layer-alignment mark 117 may be substantially the same as the length L1 of the first-layer-alignment mark 111. In some embodiments, the lengths of the second-layer-alignment mark 113, the third-layer-alignment mark 115, the fourth-layer-alignment mark 117 may be different from the length L1 of the first-layer-alignment mark 111. For example, the length L2 of the second-layer-alignment mark 113 may be the same as or different from the length L1 of the first-layer-alignment mark 111.

In some embodiments, the widths of the second-layer-alignment mark 113, the third-layer-alignment mark 115, the fourth-layer-alignment mark 117 may be substantially the same as the width W1 of the first-layer-alignment mark 111. In some embodiments, the widths of the second-layer-alignment mark 113, the third-layer-alignment mark 115, the fourth-layer-alignment mark 117 may be different from the width W1 of the first-layer-alignment mark 111. For example, the width W2 of the second-layer-alignment mark 113 may be the same as or different from the width W1 of the first-layer-alignment mark 111.

In some embodiments, in a top-view perspective, the width W1 of the first-layer-alignment mark 111 and the distance D1 between the first-layer-alignment mark 111 and the second-layer-alignment mark 113 may be different. For example, the width W1 of the first-layer-alignment mark 111 may be greater than the distance D1 between the first-layer-alignment mark 111 and the second-layer-alignment mark 113. In some embodiments, the width W1 of the first-layer-alignment mark 111 and the distance D1 between the first-layer-alignment mark 111 and the second-layer-alignment mark 113 may be substantially the same.

In some embodiments, in a top-view perspective, the distances D1, D2, D3 between the alignment marks 111, 113, 115, 117 may be substantially the same. In some embodiments, the distances D1, D2, D3 between the alignment marks 111, 113, 115, 117 may be different. For example, the distance D1 between the first-layer-alignment mark 111 and the second-layer-alignment mark 113 may be greater than or less than the distance D2 between the second-layer-alignment mark 113 and the third-layer-alignment mark 115.

In some embodiments, the first-layer-alignment mark 111, the second-layer-alignment mark 113, the third-layer-alignment mark 115, and the fourth-layer-alignment mark 117 may include a fluorescence material. In some embodiments, the fluorescence material may be azobenzene. The alignment marks 111, 113, 115, 117 including the fluorescence material may improve optical recognition during the wafer fabrication process.

With reference to FIGS. 1 to 3, the second subset of solid alignment marks 120 may include a first-layer-alignment mark 121, a second-layer-alignment mark 123, a third-layer-alignment mark 125, and a fourth-layer-alignment mark 127.

With reference to FIGS. 1 to 3, in some embodiments, the first-layer-alignment mark 121 may be line shaped in a top-view perspective. The first-layer-alignment mark 121 may extend along the direction Y. The second-layer-alignment mark 113 may be aligned with the third-layer-alignment mark 115 along the direction X and separated from the third-layer-alignment mark 115 along the direction Y. In a cross-sectional perspective, the first-layer-alignment mark 121 may be disposed in the first insulating layer 311 and on the substrate 301.

In a cross-sectional perspective, the second-layer-alignment mark 123 may be disposed in the second insulating layer 313 and may be deviated from the first-layer-alignment mark 121. In other words, the second-layer-alignment mark 123 may not be directly above the first-layer-alignment mark 121. In a top-view perspective, the second-layer-alignment mark 123 may be line shaped. The second-layer-alignment mark 123 may extend along the direction Y and may be separated from the first-layer-alignment mark 121 along the direction X. The second-layer-alignment mark 123 may be aligned with the fourth-layer-alignment mark 117 along the direction X and separated from the fourth-layer-alignment mark 117 along the direction Y.

In a cross-sectional perspective, the third-layer-alignment mark 125 may be disposed in the third insulating layer 315 and may be deviated from the second-layer-alignment mark 123. In other words, the third-layer-alignment mark 125 may not be directly above the second-layer-alignment mark 123. In a top-view perspective, the third-layer-alignment mark 125 may be line shaped. The third-layer-alignment mark 125 may extend along the direction Y and may be distant from the first-layer-alignment mark 121 along the direction X. The third-layer-alignment mark 125 may be aligned with the first-layer-alignment mark 111 along the direction X and separated from the first-layer-alignment mark 111 along the direction Y.

In a cross-sectional perspective, the fourth-layer-alignment mark 127 may be disposed in the fourth insulating layer 317 and may be deviated from the third-layer-alignment mark 125. In other words, the fourth-layer-alignment mark 127 may not be directly above the third-layer-alignment mark 125. In a top-view perspective, the fourth-layer-alignment mark 127 may be line shaped. The fourth-layer-alignment mark 127 may extend along the direction Y and may be separated from the third-layer-alignment mark 125 along the direction X. For example, the fourth-layer-alignment mark 127 may be disposed between the first-layer-alignment mark 121 and the third-layer-alignment mark 125. For another example, the fourth-layer-alignment mark 127 may be aligned with the second-layer-alignment mark 113 along the direction X. The fourth-layer-alignment mark 127 may be separated from the second-layer-alignment mark 113 along the direction Y.

In some embodiments, the first-layer-alignment mark 121, the second-layer-alignment mark 123, the third-layer-alignment mark 125, and the fourth-layer-alignment mark 127 may be aligned to each other along the direction Y. In some embodiments, the first-layer-alignment mark 121, the second-layer-alignment mark 123, the third-layer-alignment mark 125, and the fourth-layer-alignment mark 127 may not be aligned to each other along the direction Y.

In some embodiments, the width W3 of the first-layer-alignment mark 121 and the width W1 of the first-layer-alignment mark 111 may be substantially the same. In some embodiments, the width W3 of the first-layer-alignment mark 121 and the width W1 of the first-layer-alignment mark 111 may be substantially the same. In some embodiments, the length L3 of the first-layer-alignment mark 121 and the length L1 of the first-layer-alignment mark 111 may be substantially the same. In some embodiments, the length L3 of the first-layer-alignment mark 121 and the length L1 of the first-layer-alignment mark 111 may be different.

In some embodiments, the lengths of the second-layer-alignment mark 123, the third-layer-alignment mark 125, the fourth-layer-alignment mark 127 may be substantially the same as the length L3 of the first-layer-alignment mark 121. In some embodiments, the lengths of the second-layer-alignment mark 123, the third-layer-alignment mark 125, the fourth-layer-alignment mark 127 may be different from the length L3 of the first-layer-alignment mark 121. In some embodiments, the widths of the second-layer-alignment mark 123, the third-layer-alignment mark 125, the fourth-layer-alignment mark 127 may be substantially the same as the width W3 of the first-layer-alignment mark 121. In some embodiments, the widths of the second-layer-alignment mark 123, the third-layer-alignment mark 125, the fourth-layer-alignment mark 127 may be different from the width W3 of the first-layer-alignment mark 121.

In some embodiments, the length L1 of the first-layer-alignment mark 111 and the distance G1 between the third-layer-alignment mark 115 and the first-layer-alignment mark 121 may be substantially the same. In some embodiments, the length L1 of the first-layer-alignment mark 111 and the distance G1 between the third-layer-alignment mark 115 and the first-layer-alignment mark 121 may be different. For example, the length L1 of the first-layer-alignment mark 111 may be greater than the distance G1 between the third-layer-alignment mark 115 and the first-layer-alignment mark 121.

In some embodiments, the width W1 of the first-layer-alignment mark 111 and the distance G1 between the third-layer-alignment mark 115 and the first-layer-alignment mark 121 may be substantially the same. In some embodiments, the width W1 of the first-layer-alignment mark 111 and the distance G1 between the third-layer-alignment mark 115 and the first-layer-alignment mark 121 may be different. For example, the width W1 of the first-layer-alignment mark 111 may be greater than the distance G1 between the third-layer-alignment mark 115 and the first-layer-alignment mark 121.

In some embodiments, the first-layer-alignment mark 121, the second-layer-alignment mark 123, the third-layer-alignment mark 125, and the fourth-layer-alignment mark 127 may include a fluorescence material. In some embodiments, the fluorescence material may be azobenzene. The alignment marks 121, 123, 125, 127 including the fluorescence material may improve optical recognition during the wafer fabrication process.

With reference to FIGS. 1 to 3, in some embodiments, the first set of spaced alignment marks 200-1 may be disposed in a mirror manner of the first set of solid alignment marks 100-1 according to the first axis of symmetry S1. The first set of spaced alignment marks 200-1 may include a first subset of spaced alignment marks 210 and a second subset of spaced alignment marks 220. The first subset of spaced alignment marks 210 and the first subset of solid alignment marks 110 may be disposed in a mirror manner according to the first axis of symmetry S1. The second subset of spaced alignment marks 220 and the second subset of solid alignment marks 120 may be disposed in a mirror manner according to the first axis of symmetry S1.

Detailedly, the first subset of spaced alignment marks 210 may include a first-layer-alignment mark 211, a second-layer-alignment mark 213, a third-layer-alignment mark 215, and a fourth-layer-alignment mark 217. The first-layer-alignment mark 211 and the first-layer-alignment mark 111 may be disposed in the mirror manner according to the first axis of symmetry S1. The second-layer-alignment mark 213 and the second-layer-alignment mark 113 may be disposed in the mirror manner according to the first axis of symmetry S1. The third-layer-alignment mark 215 and the third-layer-alignment mark 115 may be disposed in the mirror manner according to the first axis of symmetry S1. The fourth-layer-alignment mark 217 and the fourth-layer-alignment mark 117 may be disposed in the mirror manner according to the first axis of symmetry S1.

Similarly, the second subset of spaced alignment marks 220 may include a first-layer-alignment mark 221, a second-layer-alignment mark 223, a third-layer-alignment mark 225, and a fourth-layer-alignment mark 227. The first-layer-alignment mark 221, the second-layer-alignment mark 223, the third-layer-alignment mark 225, and the fourth-layer-alignment mark 227 may be disposed in the mirror manner of the first-layer-alignment mark 121, the second-layer-alignment mark 123, the third-layer-alignment mark 125, and the fourth-layer-alignment mark 127 according to the first axis of symmetry S1, respectively and correspondingly.

With reference to FIGS. 1 to 3, in some embodiments, the second set of solid alignment marks 100-2 may be disposed in a mirror manner of the first set of solid alignment marks 100-1 according to the second axis of symmetry S2. The second set of solid alignment marks 100-2 may include a third subset of solid alignment marks 130 and a fourth subset of solid alignment marks 140. The third subset of solid alignment marks 130 and the first subset of solid alignment marks 110 may be disposed in a mirror manner according to the second axis of symmetry S2. The fourth subset of solid alignment marks 140 and the second subset of solid alignment marks 120 may be disposed in a mirror manner according to the second axis of symmetry S2.

Detailedly, the third subset of solid alignment marks 130 may include a first-layer-alignment mark 131, a second-layer-alignment mark 133, a third-layer-alignment mark 135, and a fourth-layer-alignment mark 137. The first-layer-alignment mark 131 and the first-layer-alignment mark 111 may be disposed in the mirror manner according to the second axis of symmetry S2. The second-layer-alignment mark 133 and the second-layer-alignment mark 113 may be disposed in the mirror manner according to the second axis of symmetry S2. The third-layer-alignment mark 135 and the third-layer-alignment mark 115 may be disposed in the mirror manner according to the second axis of symmetry S2. The fourth-layer-alignment mark 137 and the fourth-layer-alignment mark 117 may be disposed in the mirror manner according to the second axis of symmetry S2.

Similarly, the fourth subset of solid alignment marks 140 may include a first-layer-alignment mark 141, a second-layer-alignment mark 143, a third-layer-alignment mark 145, and a fourth-layer-alignment mark 147. The first-layer-alignment mark 141, the second-layer-alignment mark 143, the third-layer-alignment mark 145, and the fourth-layer-alignment mark 147 may be disposed in the mirror manner of the first-layer-alignment mark 121, the second-layer-alignment mark 123, the third-layer-alignment mark 125, and the fourth-layer-alignment mark 127 according to the first axis of symmetry S1, respectively and correspondingly.

With reference to FIGS. 1 to 3, in some embodiments, the second set of spaced alignment marks 200-2 may be disposed in a mirror manner of the second set of solid alignment marks 100-2 according to the first axis of symmetry S1 or the second set of spaced alignment marks 200-2 may be disposed in a mirror manner of the first set of spaced alignment marks 200-1 according to the third axis of symmetry S3. The second set of spaced alignment marks 200-2 may include a third subset of spaced alignment marks 230 and a fourth subset of spaced alignment marks 240. The third subset of spaced alignment marks 230 and the third subset of solid alignment marks 130 may be disposed in a mirror manner according to the first axis of symmetry S1. The fourth subset of spaced alignment marks 240 and the fourth subset of solid alignment marks 140 may be disposed in a mirror manner according to the first axis of symmetry S1.

Similarly, the third subset of spaced alignment marks 230 may include a first-layer-alignment mark 231, a second-layer-alignment mark 233, a third-layer-alignment mark 235, and a fourth-layer-alignment mark 237. The first-layer-alignment mark 231, the second-layer-alignment mark 233, the third-layer-alignment mark 235, and the fourth-layer-alignment mark 237 may be disposed in the mirror manner of the first-layer-alignment mark 131, the second-layer-alignment mark 133, the third-layer-alignment mark 135, and the fourth-layer-alignment mark 137 according to the first axis of symmetry S1, respectively and correspondingly.

Similarly, the fourth subset of spaced alignment marks 240 may include a first-layer-alignment mark 241, a second-layer-alignment mark 243, a third-layer-alignment mark 245, and a fourth-layer-alignment mark 247. The first-layer-alignment mark 241, the second-layer-alignment mark 243, the third-layer-alignment mark 245, and the fourth-layer-alignment mark 247 may be disposed in the mirror manner of the first-layer-alignment mark 141, the second-layer-alignment mark 143, the third-layer-alignment mark 145, and the fourth-layer-alignment mark 147 according to the first axis of symmetry S1, respectively and correspondingly.

The first-layer-alignment marks 131, 141, 211, 221, 231, 241, the second-layer-alignment marks 133, 143, 213, 223, 233, 243, the third-layer-alignment marks 135, 145, 215, 225, 235, 245, and the fourth-layer-alignment marks 137, 147, 217, 227, 237, 247 may include a fluorescence material. In some embodiments, the fluorescence material may be azobenzene. The alignment marks 131, 141, 211, 221, 231, 241, 133, 143, 213, 223, 233, 243, 135, 145, 215, 225, 235, 245, 137, 147, 217, 227, 237, 247 including the fluorescence material may improve optical recognition during the wafer fabrication process.

Figure 4:
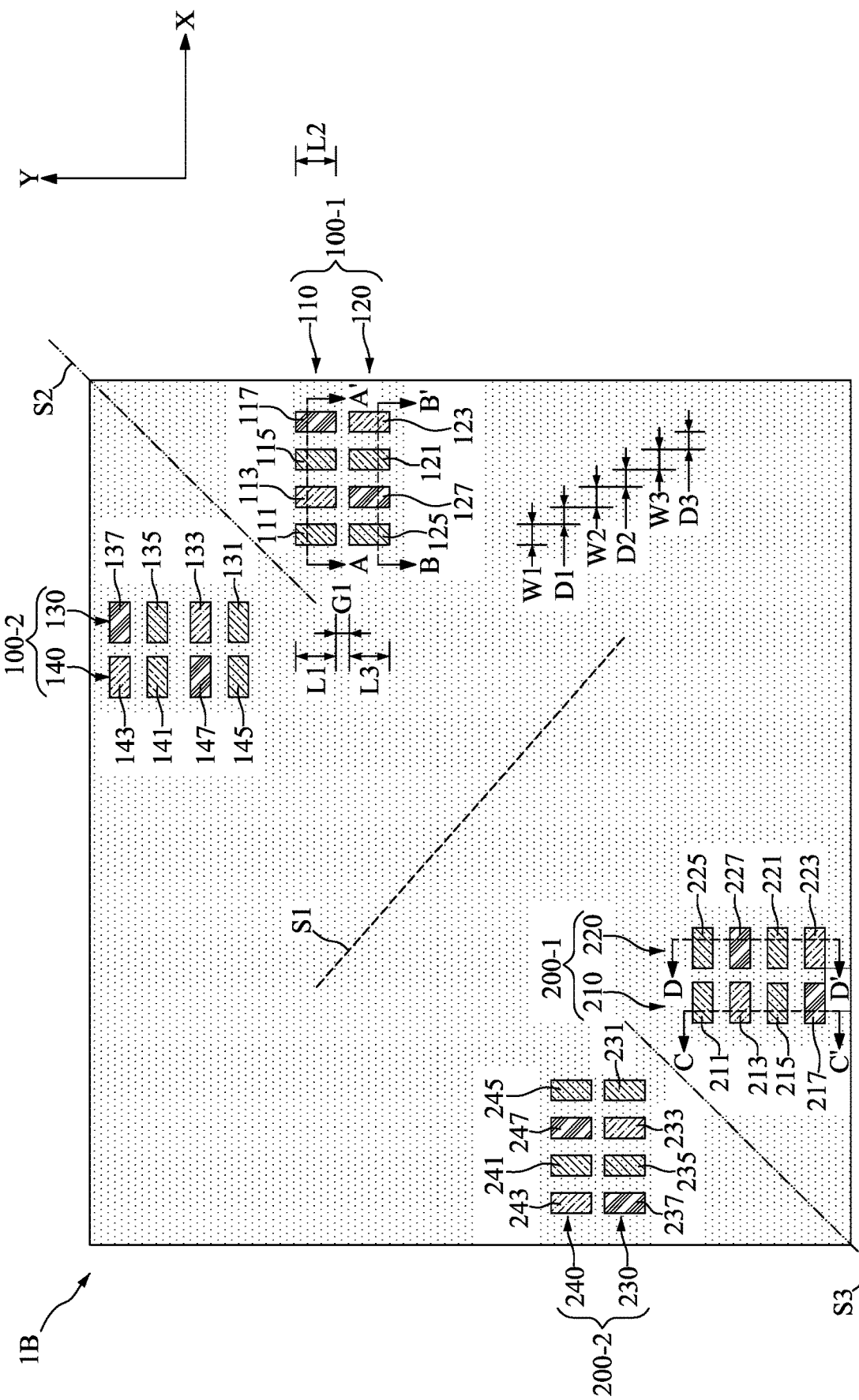
FIG. 4 illustrates, in a schematic top-view diagram, a semiconductor device in accordance with another embodiment of the present disclosure.
Figure 5:
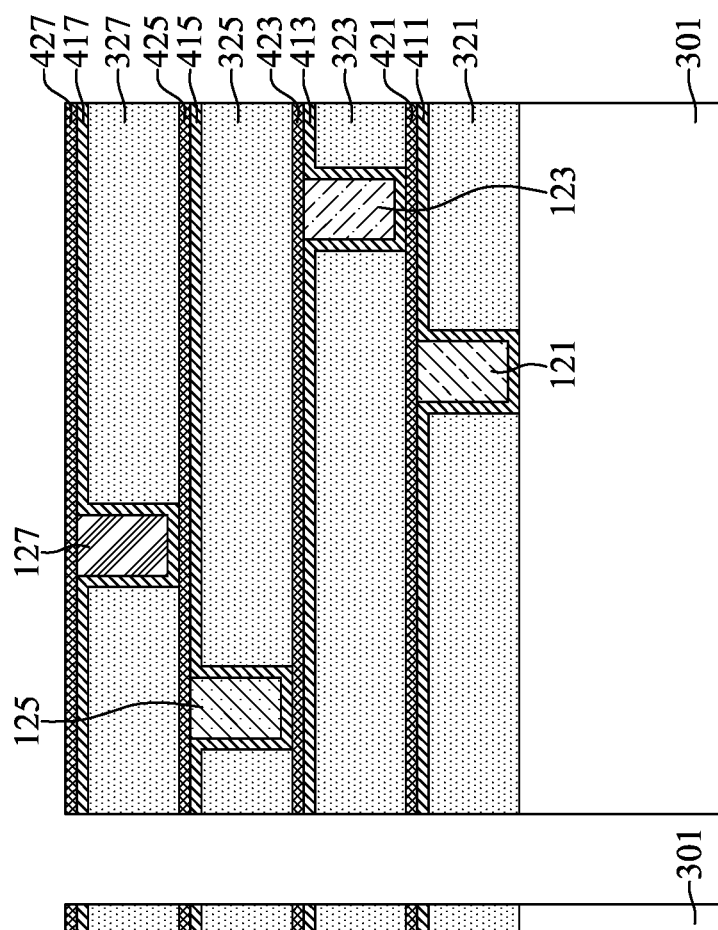
FIGS. 5 and 6 are schematic cross-sectional view diagrams taken along lines A-A', B-B', C-C', and D-D' in FIG. 4.
Figure 6:
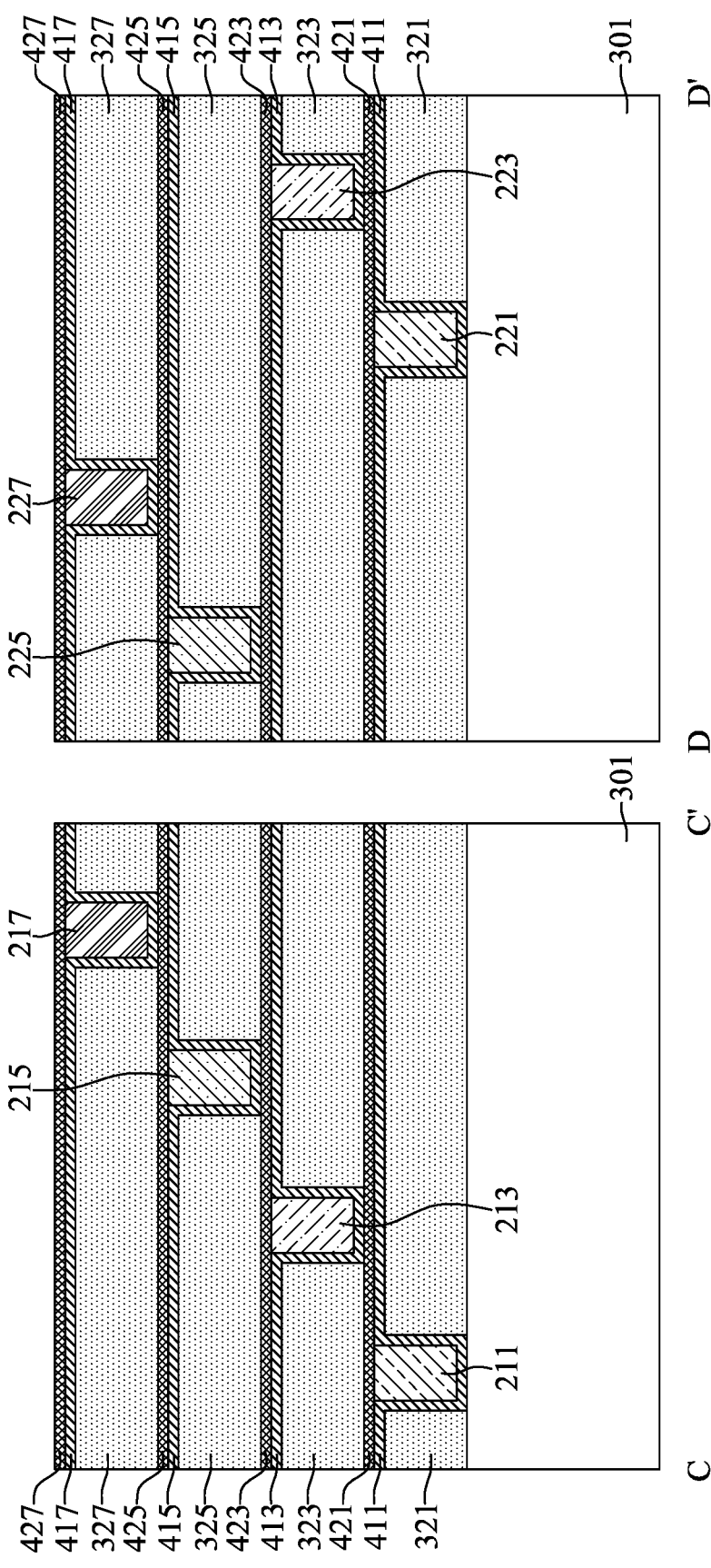

FIG. 4 illustrates, in a schematic top-view diagram, a semiconductor device 1B in accordance with another embodiment of the present disclosure. FIG. 5 is a schematic cross-sectional view diagram taken along lines A-A' and B-B' in FIG. 4. FIG. 6 is a schematic cross-sectional view diagram taken along lines C-C' and D-D' in FIG. 4.

With reference to FIGS. 4 to 6, the semiconductor device 1B may include a first conductive layer 321, a second conductive layer 323, a third conductive layer 325, a fourth conductive layer 327, a first set of solid alignment marks 100-1, a second set of solid alignment marks 100-2, a first set of spaced alignment marks 200-1, a second set of spaced alignment marks 200-2, a first bottom liner 411, a second bottom liner 413, a third bottom liner 415, a fourth bottom liner 417, a first top liner 421, a second top liner 423, a third top liner 425, and a fourth top liner 427.

The substrate 301 may have a structure similar to that illustrated in FIGS. 1 to 3, and descriptions thereof are not repeated herein. The first conductive layer 321, the second conductive layer 323, the third conductive layer 325, and the fourth top liner 427 may be sequentially stacked on the substrate 301. The first conductive layer 321, the second conductive layer 323, the third conductive layer 325, and the fourth top liner 427 may be formed of, for example, tungsten, cobalt, zirconium, tantalum, titanium, aluminum, ruthenium, copper, metal carbides, metal nitrides, transition metal aluminides, or a combination thereof. In some embodiments, the first conductive layer 321, the second conductive layer 323, the third conductive layer 325, and the fourth top liner 427 may be part of the conductive features of the substrate 301. In some embodiments, the conductive layers 321, 323, 325, 327 may be electrically coupled to the plurality of device elements of the substrate 301 but are not limited thereto. In some embodiments, the conductive layers 321, 323, 325, 327 may be configured as testing circuits.

With reference to FIGS. 4 to 6, the first set of solid alignment marks 100-1, the second set of solid alignment marks 100-2, the first set of spaced alignment marks 200-1, and the second set of spaced alignment marks 200-2 may be disposed in a manner similar to that illustrated in FIGS. 1 to 3. The difference may be that the first-layer-alignment marks 111, 121, 131, 141, 211, 221, 231, 241 may be disposed in the first conductive layer 321, the second-layer-alignment marks 113, 123, 133, 143, 213, 223, 233, 243 may be disposed in the second conductive layer 323, the third-layer-alignment marks 115, 125, 135, 145, 215, 225, 235, 245 may be disposed in the third conductive layer 325, and the fourth-layer-alignment marks 117, 127, 137, 147, 217, 227, 237, 247 may be disposed in the fourth conductive layer 327.

With reference to FIGS. 4 to 6, the first bottom liner 411 may be disposed between the second conductive layer 323 and the first conductive layer 321, between the first-layer-alignment marks 111, 121, 131, 141, 211, 221, 231, 241 and the first conductive layer 321, and between the first-layer-alignment marks 111, 121, 131, 141, 211, 221, 231, 241 and the substrate 301. The first top liner 421 may be disposed between the first top liner 421 and the second conductive layer 323, and between the first-layer-alignment marks 111, 121, 131, 141, 211, 221, 231, 241 and the second conductive layer 323. The second bottom liner 413, the third bottom liner 415, and the fourth bottom liner 417 may be disposed in a manner similar to the first bottom liner 411, and descriptions thereof are not repeated herein. The second top liner 423, the third top liner 425, and the fourth top liner 427 may be disposed in a manner similar to the first top liner 421, and descriptions thereof are not repeated herein.

In some embodiments, the first bottom liner 411, the second bottom liner 413, the second bottom liner 413, and the fourth bottom liner 417 may be formed of, for example, silicon oxide, silicon nitride, silicon oxynitride, silicon nitride oxide, the like, or a combination thereof. In some embodiments, the first top liner 421, the second top liner 423, the third top liner 425, and the fourth top liner 427 may be formed of, for example, silicon oxide, silicon nitride, silicon oxynitride, silicon nitride oxide, the like, or a combination thereof. The bottom liners 411, 413, 415, 417 and the top liners 421, 423, 425, 427 may be served as barrier layers to prevent the fluorescence material in the alignment marks diffusing out to contaminate adjacent elements.

It should be noted that the bottom liners 411, 413, 415, 417 completely covering the conductive layers 321, 323, 325, 327 in FIGS. 5 and 6 are just for illustration purpose, some portions of the conductive layers 321, 323, 325, 327 may be exposed for electrically coupling to other conductive features.

Figure 7:
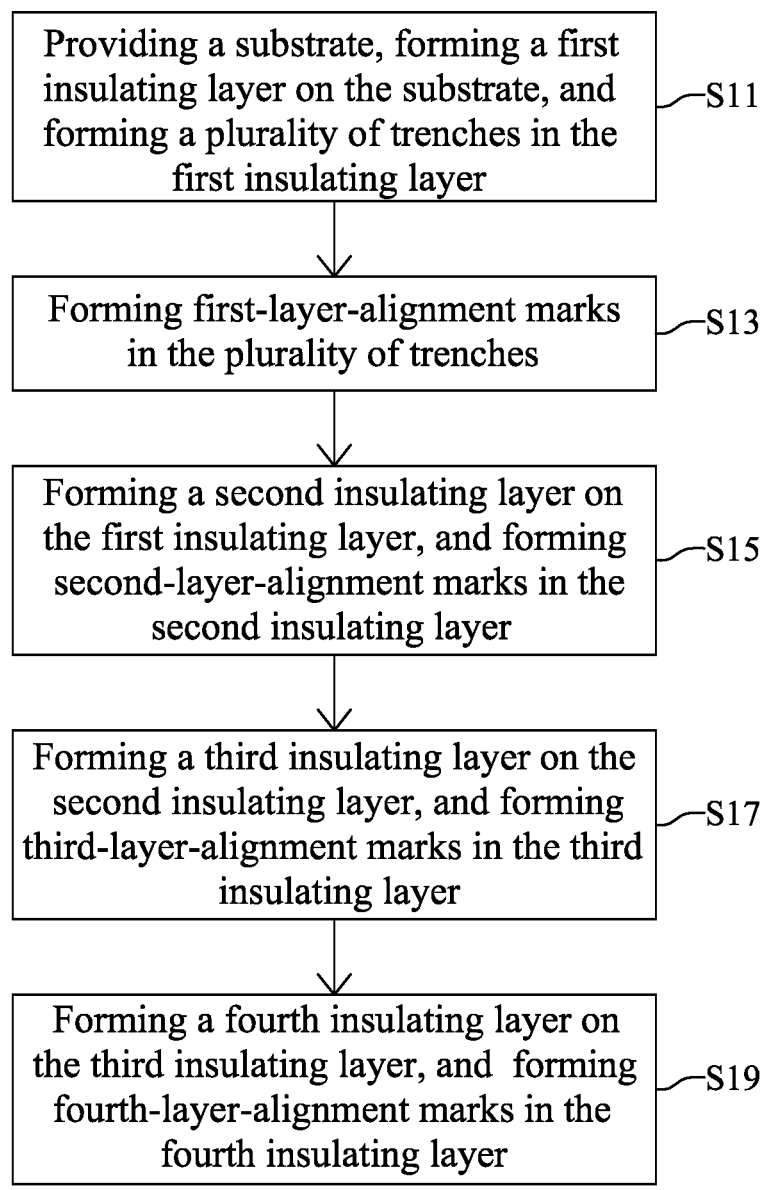
FIG. 7 illustrates, in a flowchart diagram form, a method for fabricating a semiconductor device in accordance with one embodiment of the present disclosure.
Figure 8:
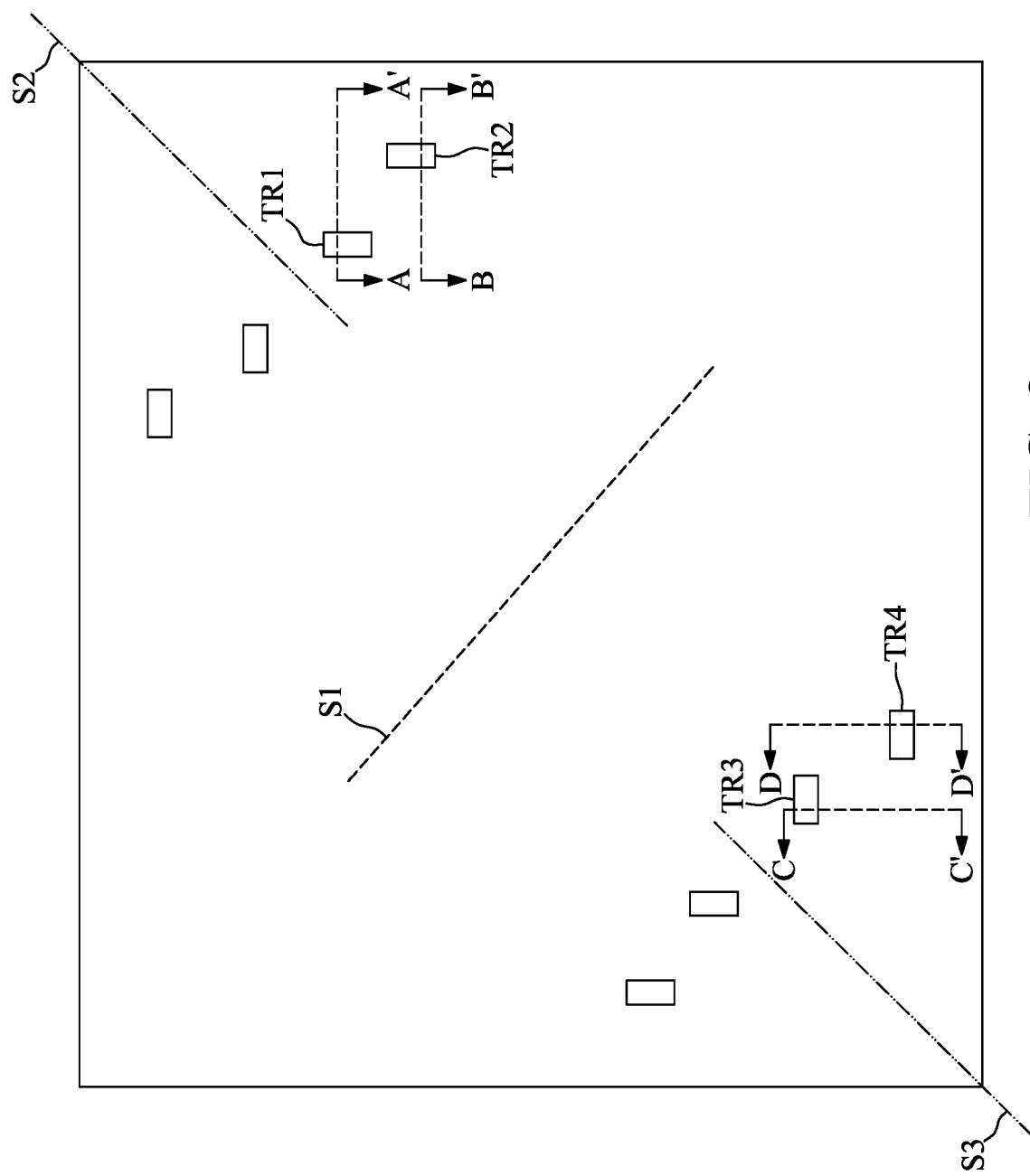
FIG. 8 illustrates, in a schematic top-view diagram, an intermediate semiconductor device in accordance with one embodiment of the present disclosure.
Figure 9:
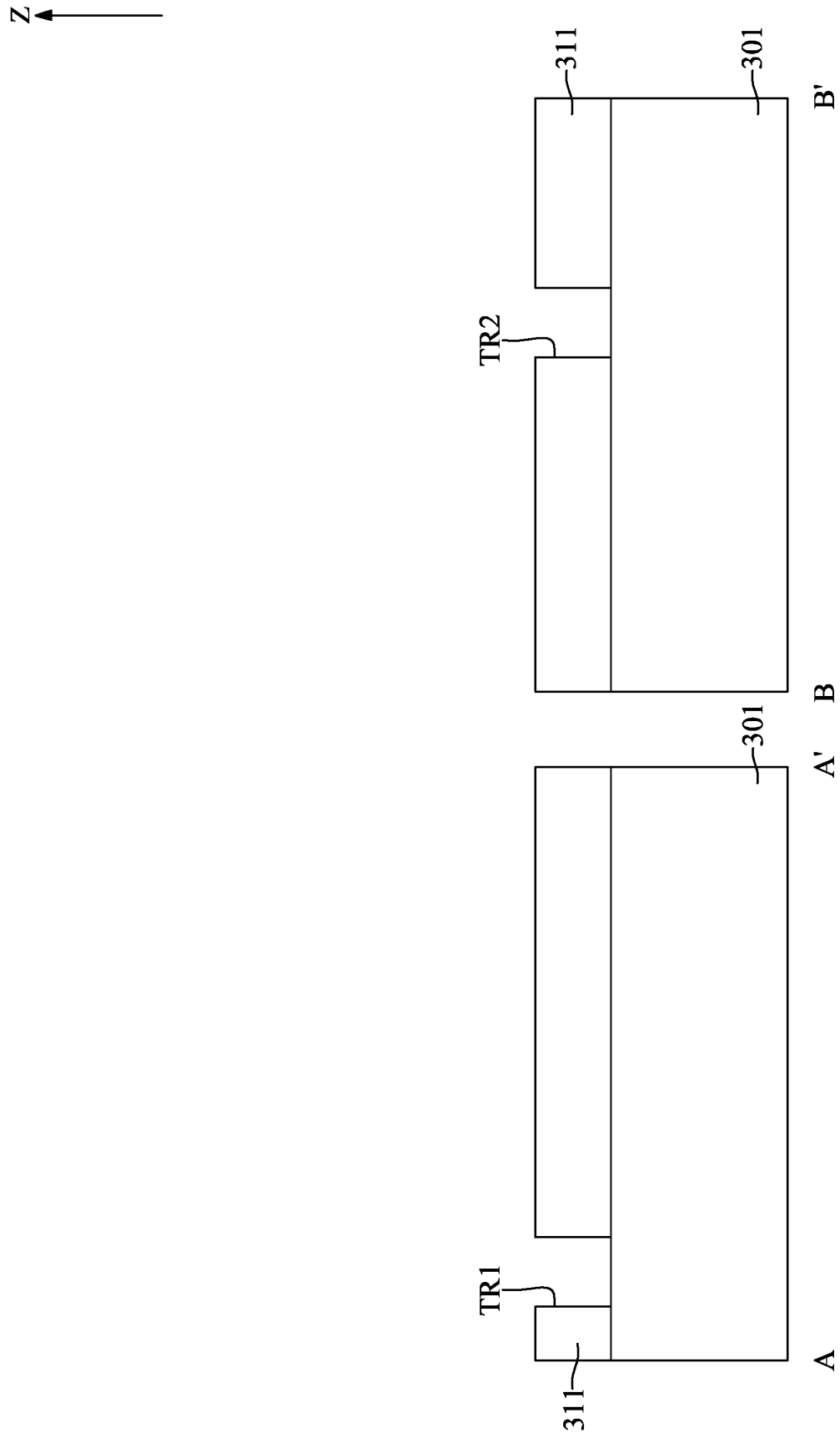
FIGS. 9 and 10 are schematic cross-sectional view diagram taken along lines A-A', B-B', C-C', and D-D' in FIG. 8 illustrating part of the flow for fabricating the semiconductor device in accordance with one embodiment of the present disclosure.
Figure 10:
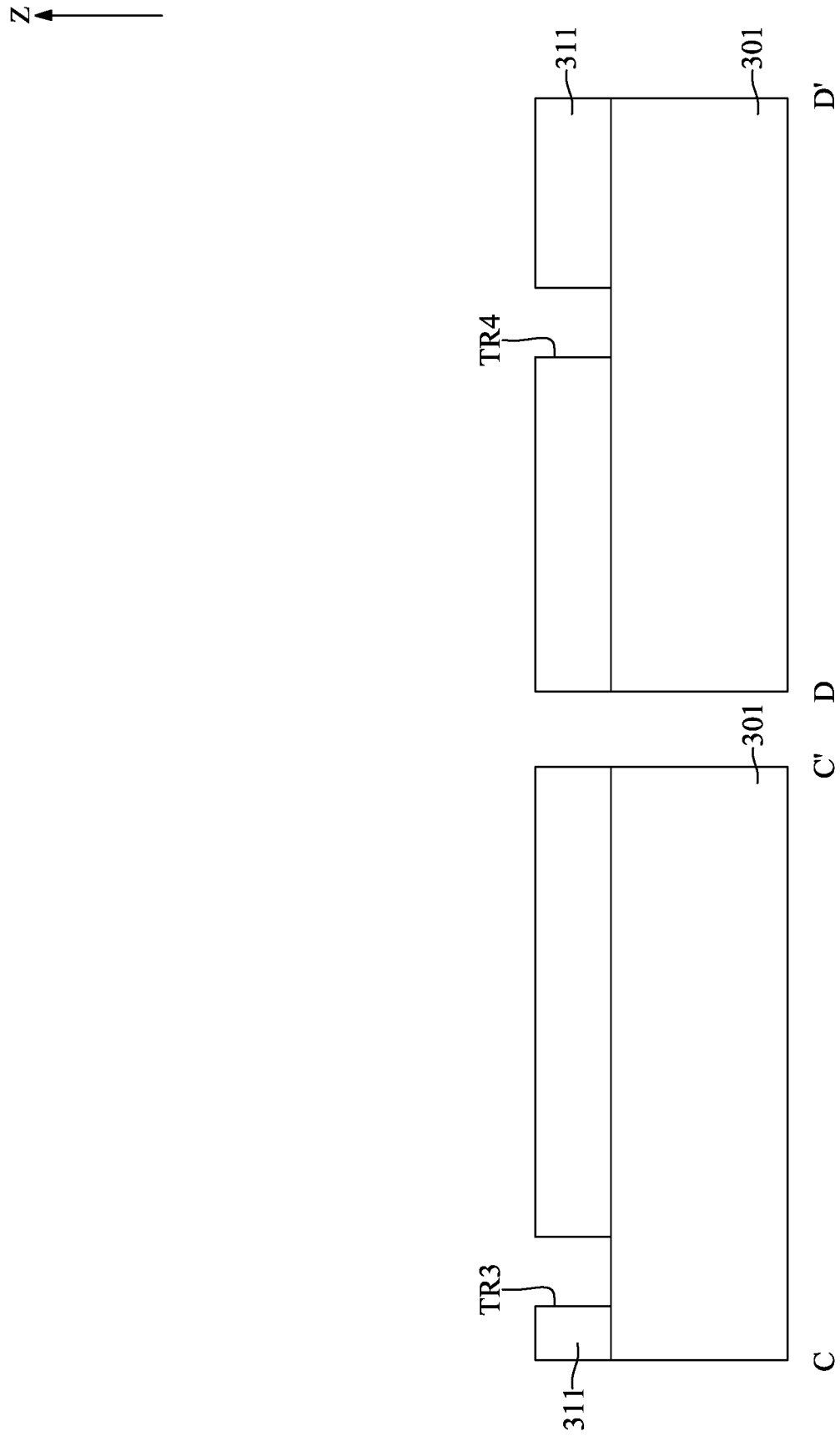

FIG. 7 illustrates, in a flowchart diagram form, a method 10 for fabricating a semiconductor device 1A in accordance with one embodiment of the present disclosure. FIG. 8 illustrates, in a schematic top-view diagram, an intermediate semiconductor device in accordance with one embodiment of the present disclosure. FIG. 9 is a schematic cross-sectional view diagram taken along lines A-A' and B-B' in FIG. 8 illustrating part of the flow for fabricating the semiconductor device 1A in accordance with one embodiment of the present disclosure. FIG. 10 is a schematic cross-sectional view diagram taken along lines C-C' and D-D' in FIG. 8 illustrating part of the flow for fabricating the semiconductor device 1A in accordance with one embodiment of the present disclosure.

With reference to FIGS. 7 to 10, at step S11, a substrate 301 may be provided, a first insulating layer 311 may be formed on the substrate 301, and a plurality of trenches TR1, TR2, TR3, TR4 may be formed in the first insulating layer 311.

With reference to FIGS. 8 to 10, the first insulating layer 311 may be formed on the substrate 301 by, for example, chemical vapor deposition or other applicable deposition process. The plurality of trenches TR1, TR2, TR3, TR4 may be formed in the first insulating layer 311 by a photolithography process and a following etch process. Portions of the substrate 301 may be exposed through the plurality of trenches TR1, TR2, TR3, TR4.

Figure 11:
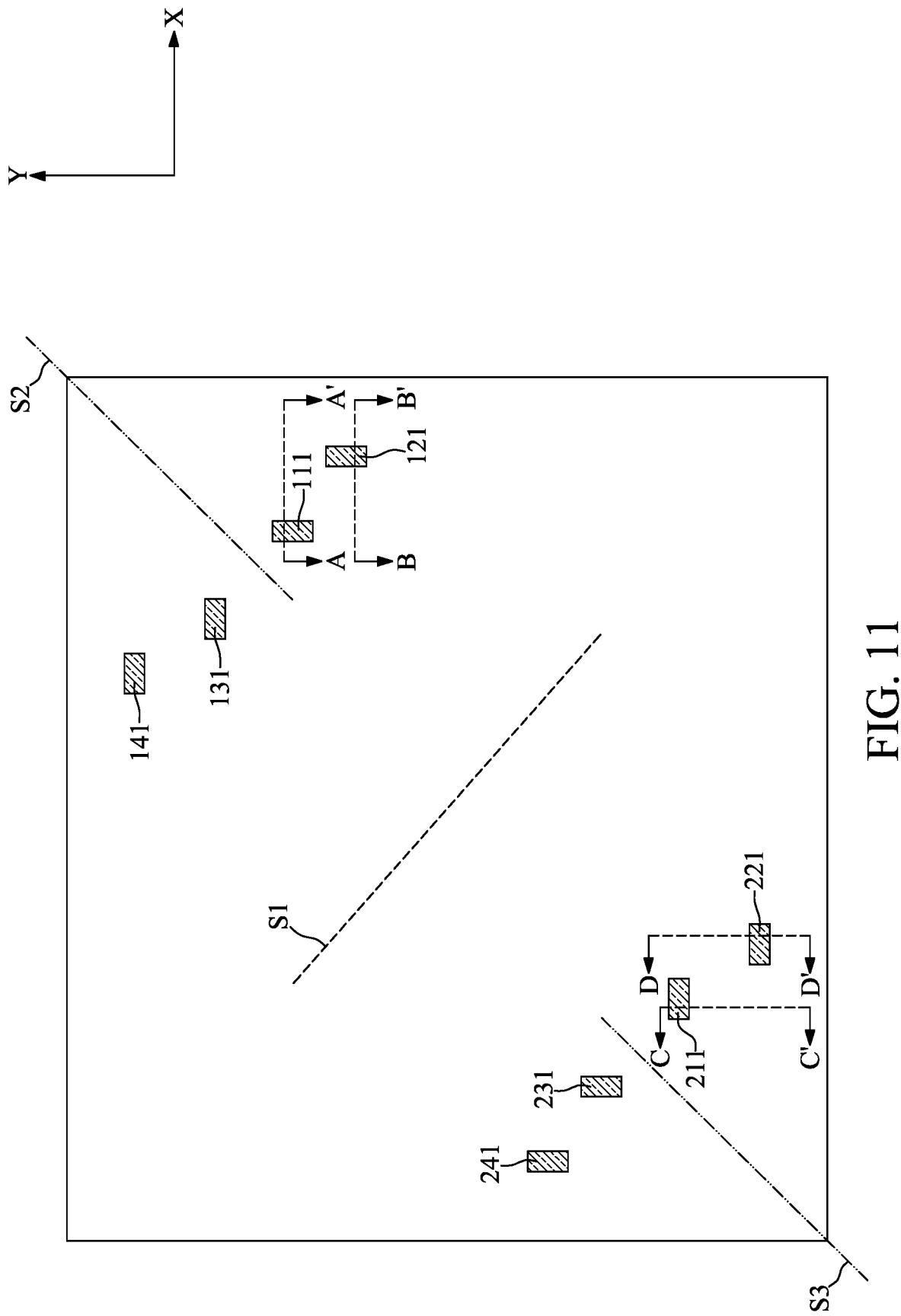
FIG. 11 illustrates, in a schematic top-view diagram, an intermediate semiconductor device in accordance with one embodiment of the present disclosure.
Figure 12:
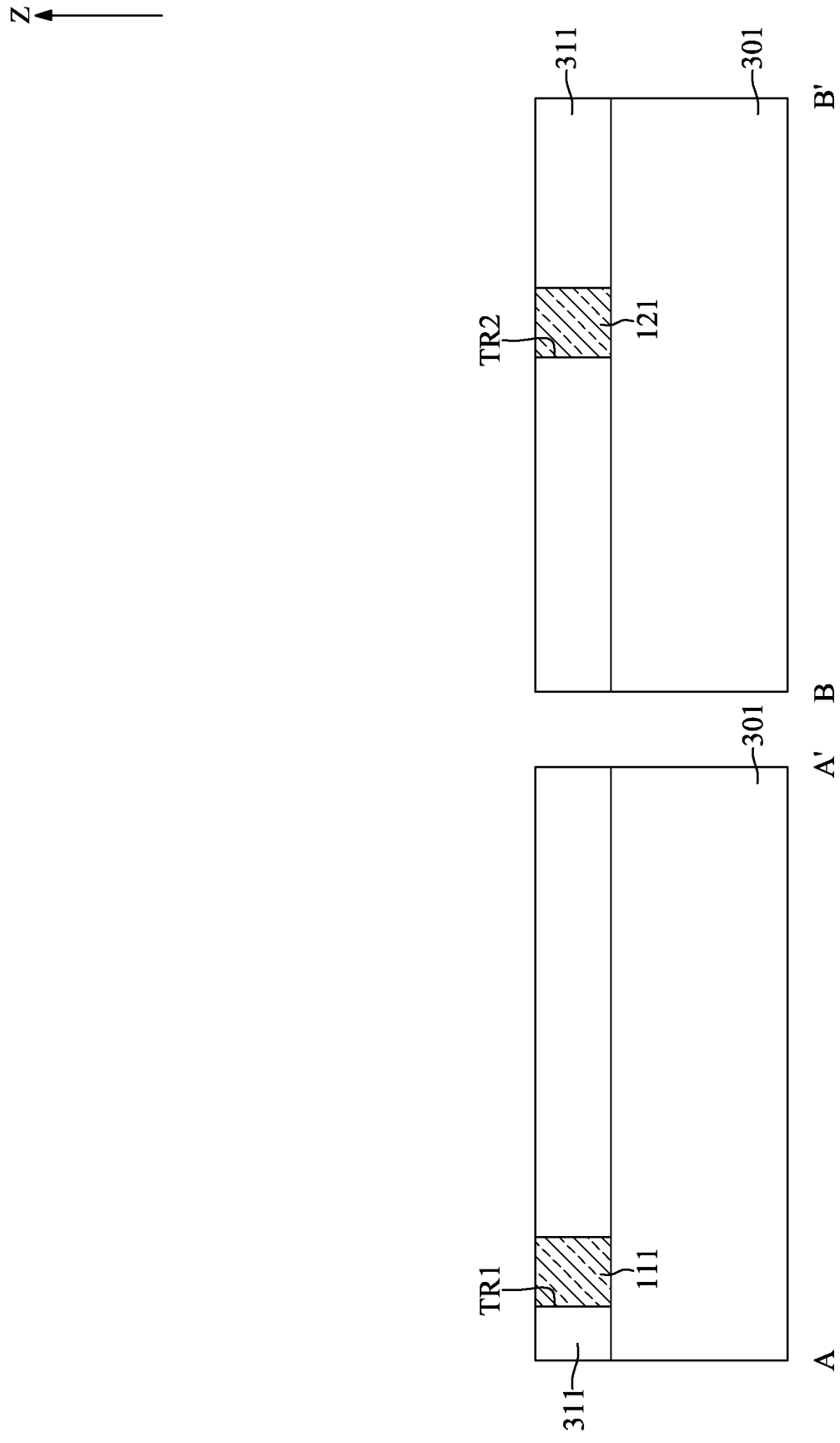
FIGS. 12 and 13 are schematic cross-sectional view diagram taken along lines A-A', B-B', C-C', and D-D' in FIG. 11 illustrating part of the flow for fabricating the semiconductor device in accordance with one embodiment of the present disclosure.
Figure 13:
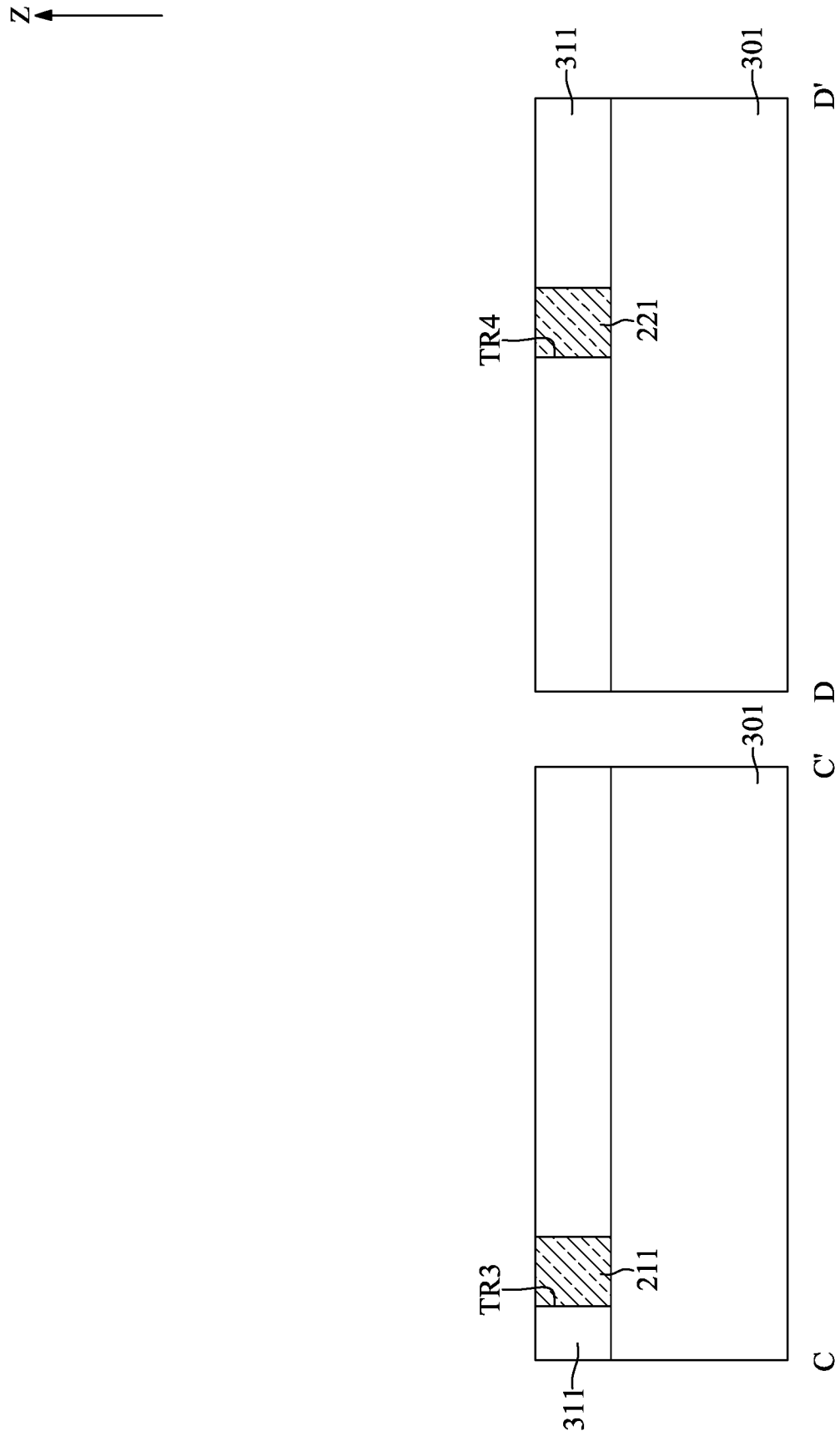

FIG. 11 illustrates, in a schematic top-view diagram, an intermediate semiconductor device in accordance with one embodiment of the present disclosure. FIG. 12 is a schematic cross-sectional view diagram taken along lines A-A' and B-B' in FIG. 11 illustrating part of the flow for fabricating the semiconductor device 1A in accordance with one embodiment of the present disclosure. FIG. 13 is a schematic cross-sectional view diagram taken along lines C-C' and D-D' in FIG. 11 illustrating part of the flow for fabricating the semiconductor device 1A in accordance with one embodiment of the present disclosure.

With reference to FIG. 7 and FIGS. 11 to 13, at step S13, first-layer-alignment marks 111, 121, 131, 141, 211, 221, 231, 241 may be formed in the plurality of trenches TR1, TR2, TR3, TR4.

With reference to FIGS. 11 to 13, an insulating layer (not shown) may be deposited to completely fill the plurality of trenches TR1, TR2, TR3, TR4. The insulating layer may include a fluorescence material. In some embodiments, the fluorescence material may be azobenzene. In some embodiments, the insulating layer may be formed by, for example, chemical vapor deposition. A planarization process, such as chemical mechanical polishing, may be performed until the top surface of the first insulating layer 311 is exposed to remove excess material, provide a substantially flat surface for subsequent processing steps, and concurrently form the first-layer-alignment marks 111, 121, 131, 141, 211, 221, 231, 241.

Figure 14:
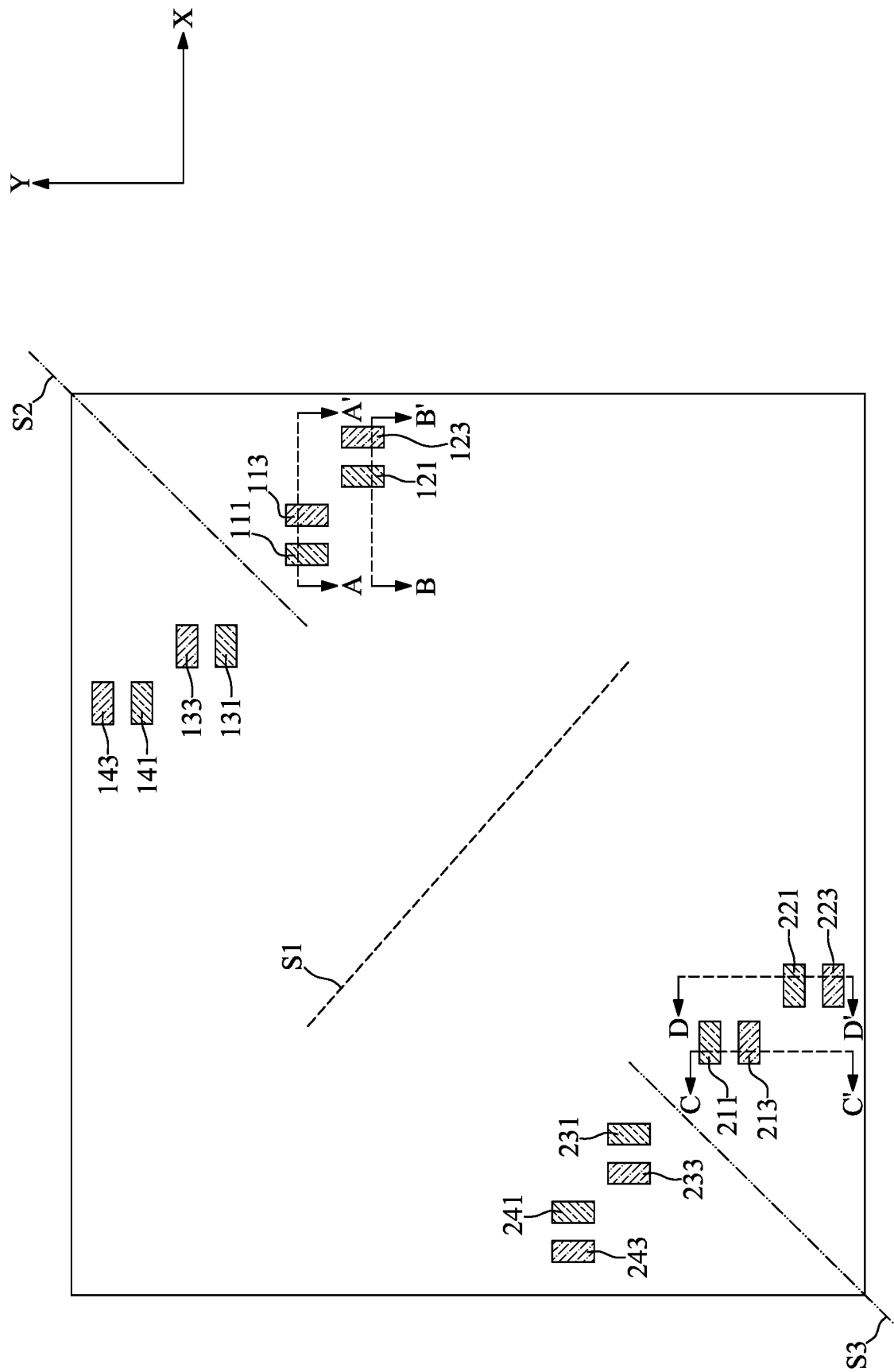
FIG. 14 illustrates, in a schematic top-view diagram, an intermediate semiconductor device in accordance with one embodiment of the present disclosure.
Figure 15:
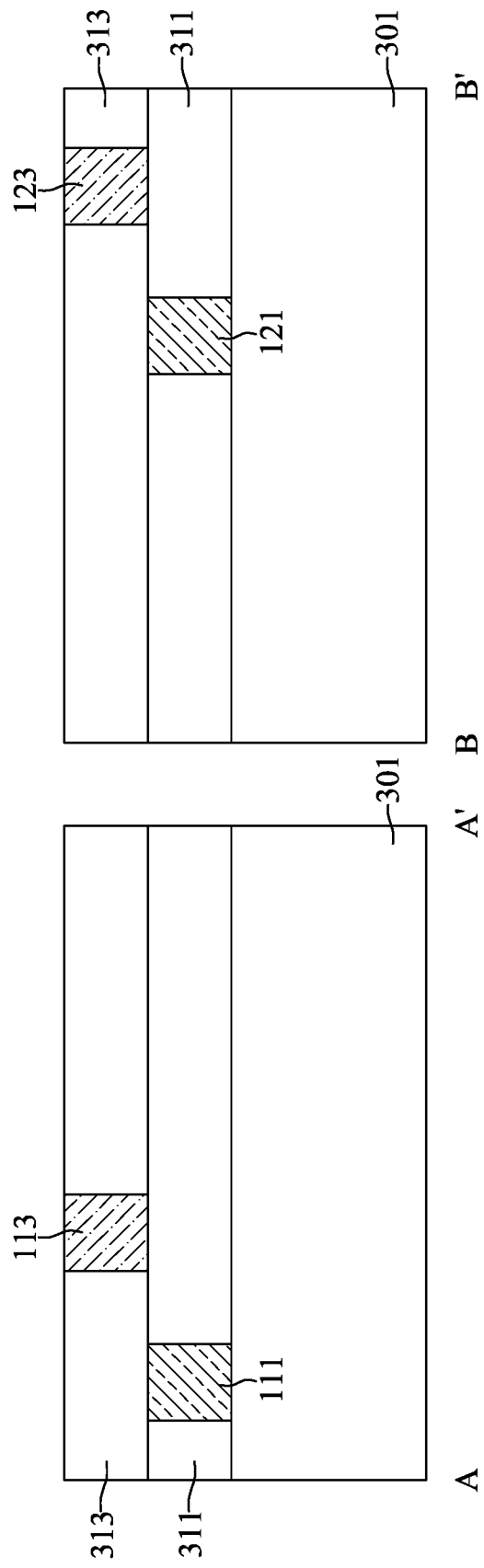
FIGS. 15 and 16 are schematic cross-sectional view diagram taken along lines A-A', B-B', C-C', and D-D' in FIG. 14 illustrating part of the flow for fabricating the semiconductor device in accordance with one embodiment of the present disclosure.
Figure 16:
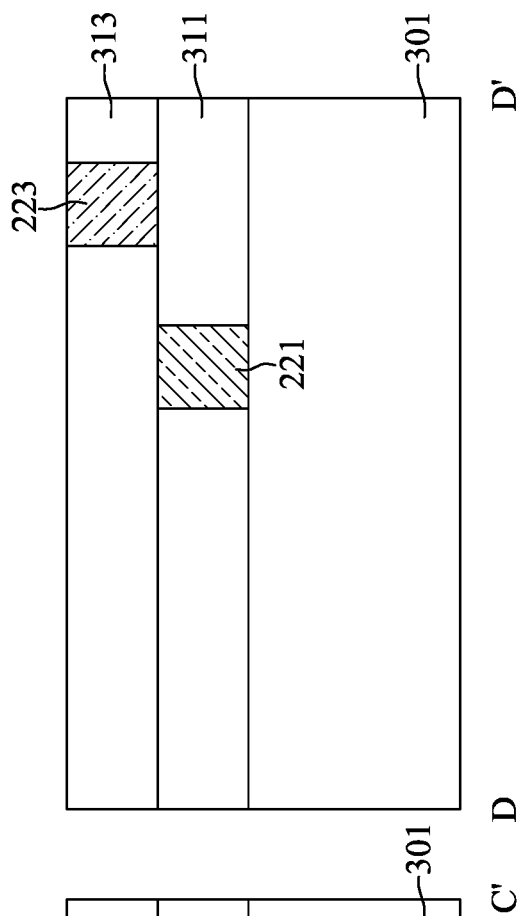
Figure 16:
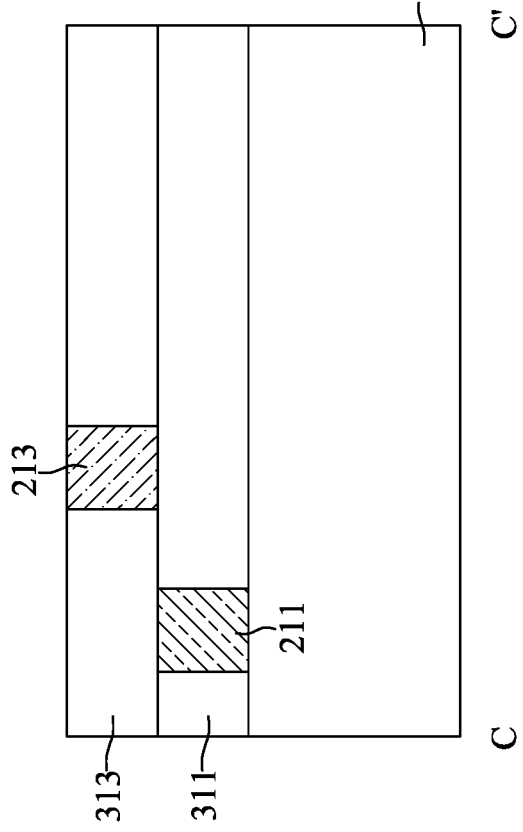

FIG. 14 illustrates, in a schematic top-view diagram, an intermediate semiconductor device in accordance with one embodiment of the present disclosure. FIG. 15 is a schematic cross-sectional view diagram taken along lines A-A' and B-B' in FIG. 14 illustrating part of the flow for fabricating the semiconductor device 1A in accordance with one embodiment of the present disclosure. FIG. 16 is a schematic cross-sectional view diagram taken along lines C-C' and D-D' in FIG. 14 illustrating part of the flow for fabricating the semiconductor device 1A in accordance with one embodiment of the present disclosure.

With reference to FIG. 7 and FIGS. 14 to 16, at step S15, a second insulating layer 313 may be formed on the first insulating layer 311, and second-layer-alignment marks 113, 123, 133, 143, 213, 223, 233, 243 may be formed in the second insulating layer 313.

With reference to FIGS. 14 to 16, the second insulating layer 313 may have a structure similar to the first insulating layer 311 and may be formed with a procedure similar to the first insulating layer 311, and descriptions thereof are not repeated herein. The second-layer-alignment marks 113, 123, 133, 143, 213, 223, 233, 243 may be formed with a procedure similar to the first-layer-alignment marks 111, 121, 131, 141, 211, 221, 231, 241, and descriptions thereof are not repeated herein.

Figure 17:
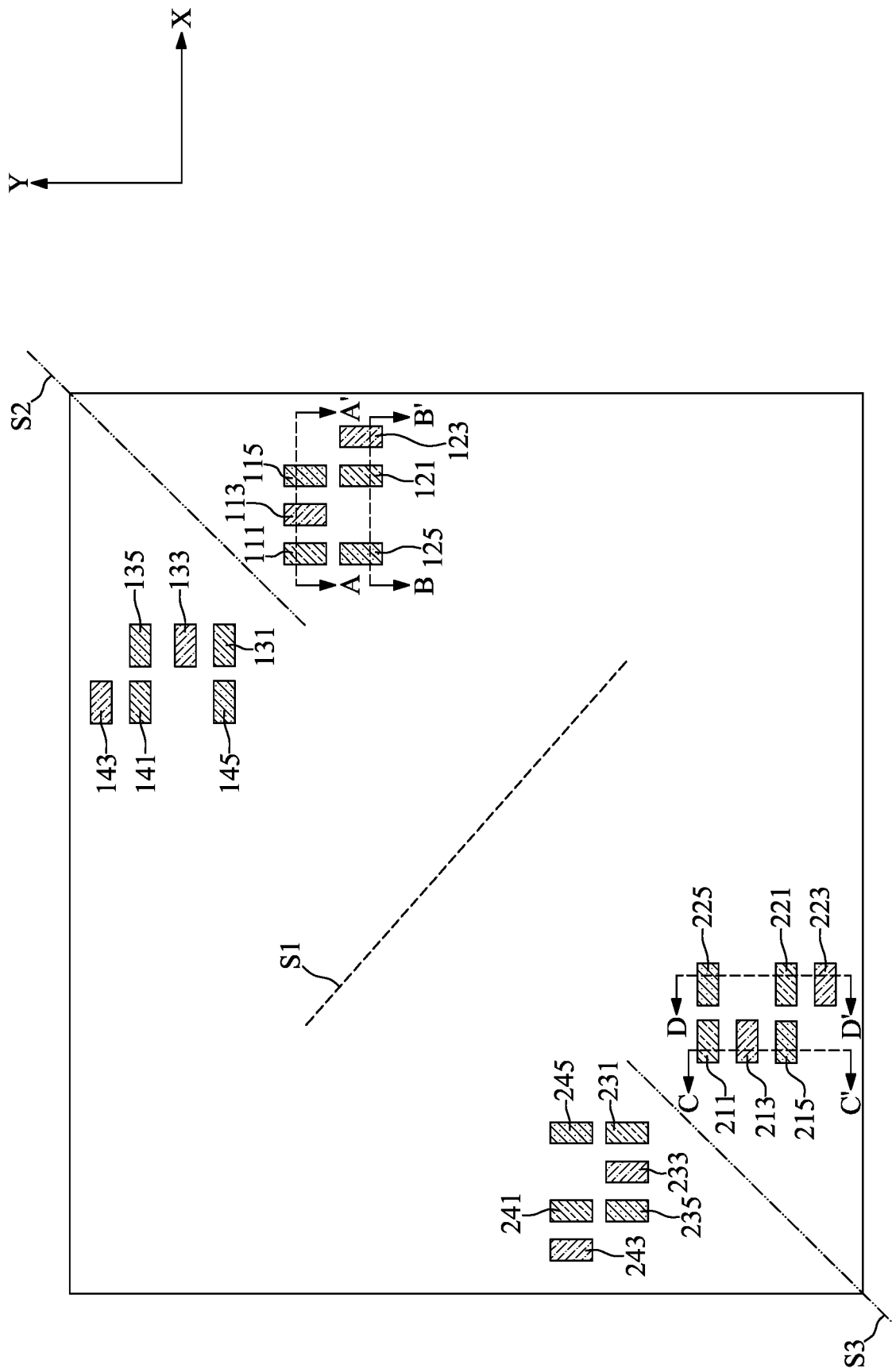
FIG. 17 illustrates, in a schematic top-view diagram, an intermediate semiconductor device in accordance with one embodiment of the present disclosure.
Figure 18:
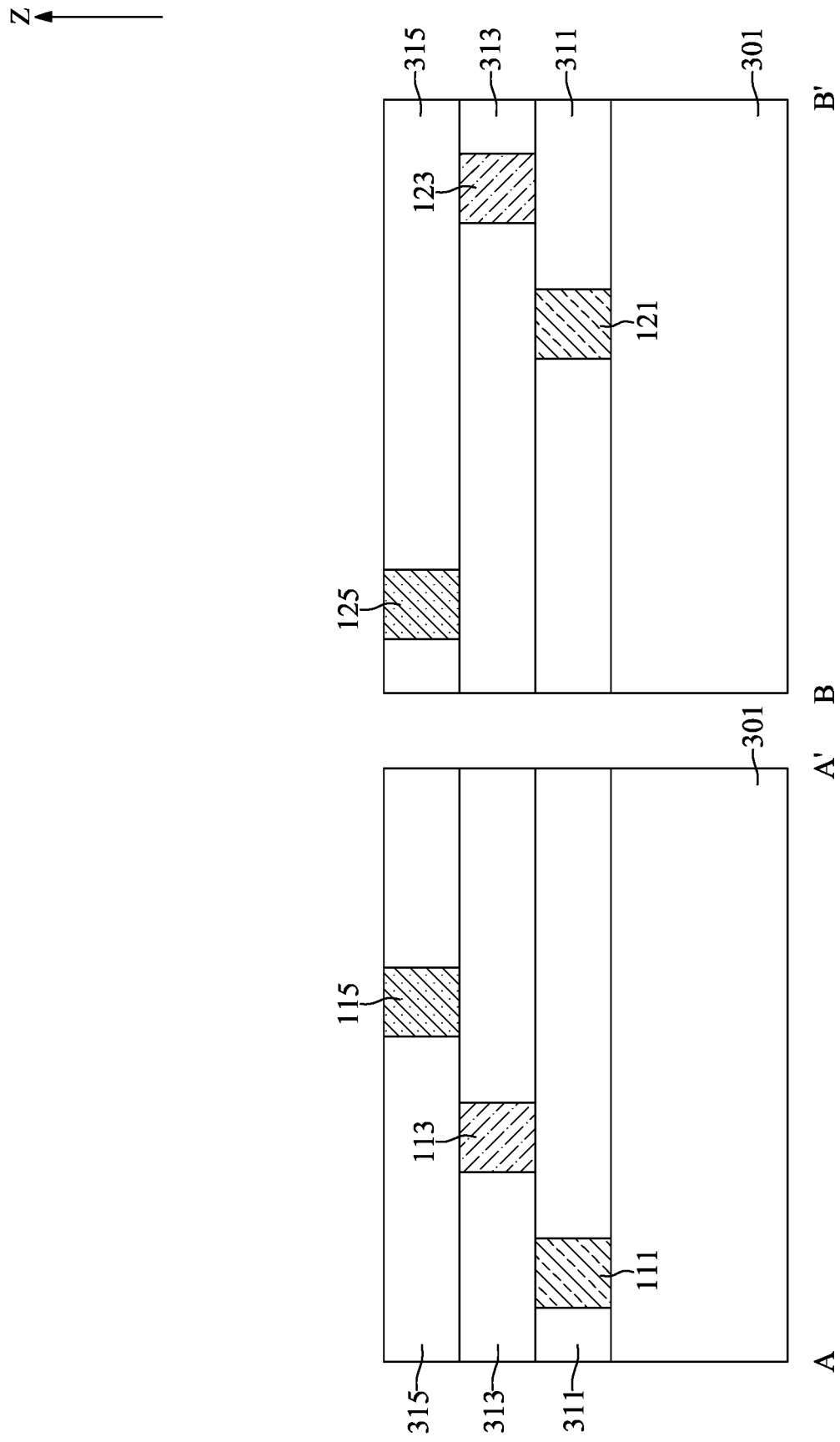
FIGS. 18 and 19 are schematic cross-sectional view diagram taken along lines A-A', B-B', C-C', and D-D' in FIG. 17 illustrating part of the flow for fabricating the semiconductor device in accordance with one embodiment of the present disclosure.
Figure 19:
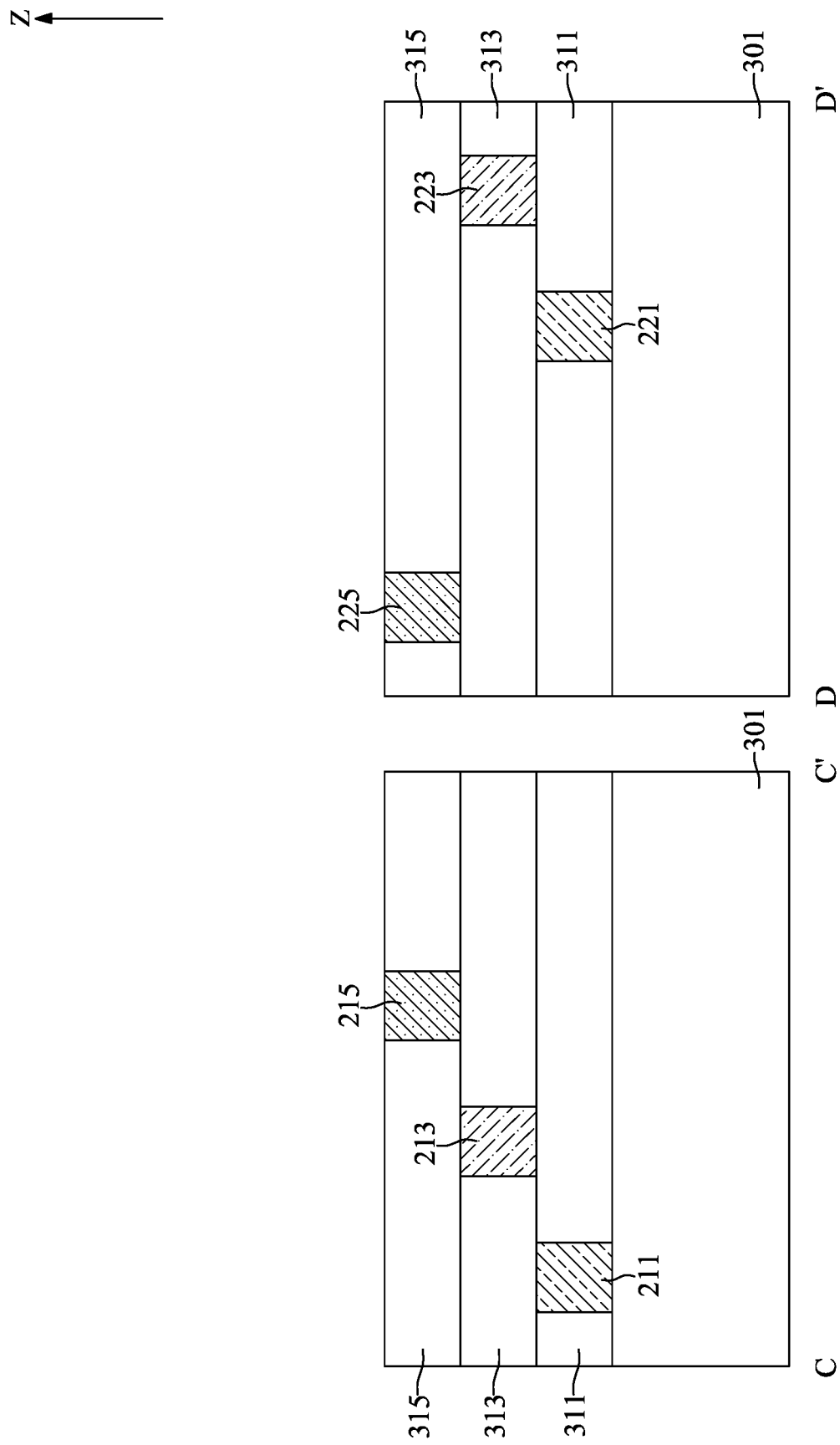

FIG. 17 illustrates, in a schematic top-view diagram, an intermediate semiconductor device in accordance with one embodiment of the present disclosure. FIG. 18 is a schematic cross-sectional view diagram taken along lines A-A' and B-B' in FIG. 17 illustrating part of the flow for fabricating the semiconductor device 1A in accordance with one embodiment of the present disclosure. FIG. 19 is a schematic cross-sectional view diagram taken along lines C-C' and D-D' in FIG. 17 illustrating part of the flow for fabricating the semiconductor device 1A in accordance with one embodiment of the present disclosure.

With reference to FIG. 7 and FIGS. 17 to 19, at step S17, a third insulating layer 315 may be formed on the second insulating layer 313, and third-layer-alignment marks 115, 125, 135, 145, 215, 225, 235, 245 may be formed in the third insulating layer 315.

With reference to FIGS. 17 to 19, the third insulating layer 315 may have a structure similar to the first insulating layer 311 and may be formed with a procedure similar to the first insulating layer 311, and descriptions thereof are not repeated herein. The third-layer-alignment marks 115, 125, 135, 145, 215, 225, 235, 245 may be formed with a procedure similar to the first-layer-alignment marks 111, 121, 131, 141, 211, 221, 231, 241, and descriptions thereof are not repeated herein.

Figure 20:
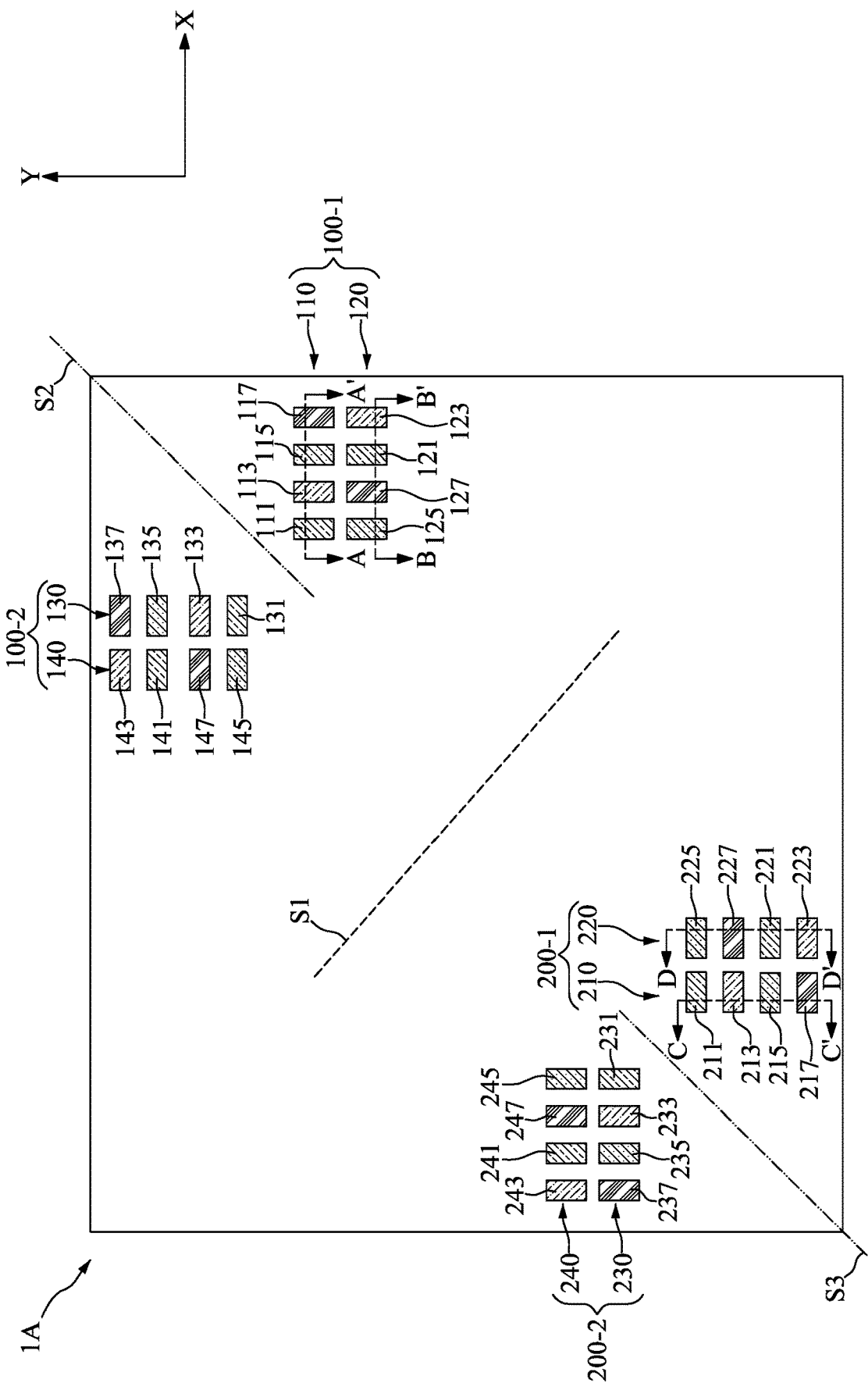
FIG. 20 illustrates, in a schematic top-view diagram, an intermediate semiconductor device in accordance with one embodiment of the present disclosure.
Figure 21:
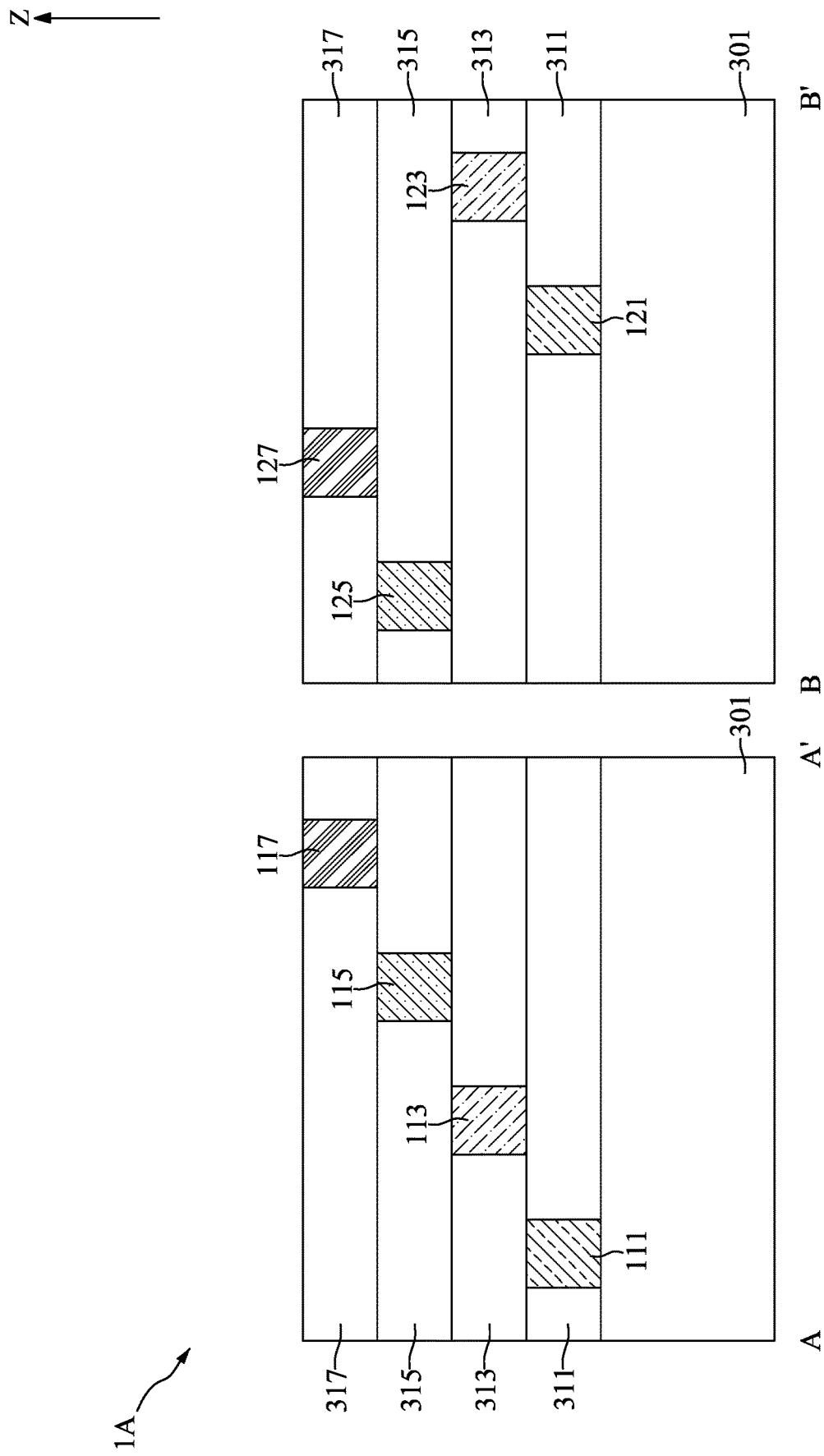
FIGS. 21 and 22 are schematic cross-sectional view diagram taken along lines A-A', B-B', C-C', and D-D' in FIG. 20 illustrating part of the flow for fabricating the semiconductor device in accordance with one embodiment of the present disclosure.
Figure 22:
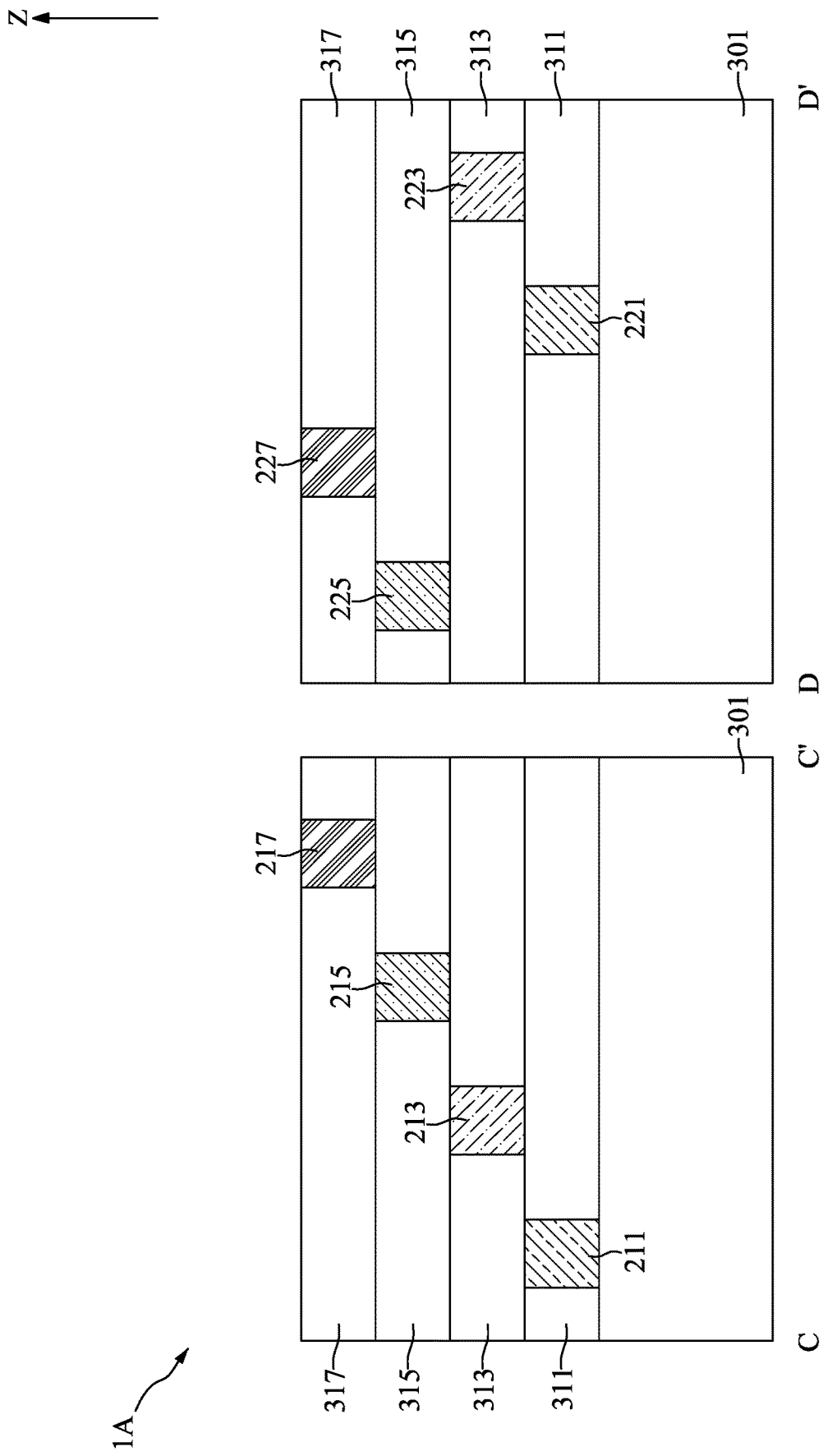

FIG. 20 illustrates, in a schematic top-view diagram, an intermediate semiconductor device in accordance with one embodiment of the present disclosure. FIG. 21 is a schematic cross-sectional view diagram taken along lines A-A' and B-B' in FIG. 20 illustrating part of the flow for fabricating the semiconductor device 1A in accordance with one embodiment of the present disclosure. FIG. 22 is a schematic cross-sectional view diagram taken along lines C-C' and D-D' in FIG. 20 illustrating part of the flow for fabricating the semiconductor device 1A in accordance with one embodiment of the present disclosure.

With reference to FIG. 7 and FIGS. 20 to 22, at step S19, a fourth insulating layer 317 may be formed on the third insulating layer 315, and fourth-layer-alignment marks 117, 127, 137, 147, 217, 227, 237, 247 may be formed in the fourth insulating layer 317.

With reference to FIGS. 20 to 22, the fourth insulating layer 317 may have a structure similar to the first insulating layer 311 and may be formed with a procedure similar to the first insulating layer 311, and descriptions thereof are not repeated herein. The fourth layer alignment marks 117, 127, 137, 147, 217, 227, 237, 247 may be formed with a procedure similar to the first-layer-alignment marks 111, 121, 131, 141, 211, 221, 231, 241, and descriptions thereof are not repeated herein.

Figure 23:
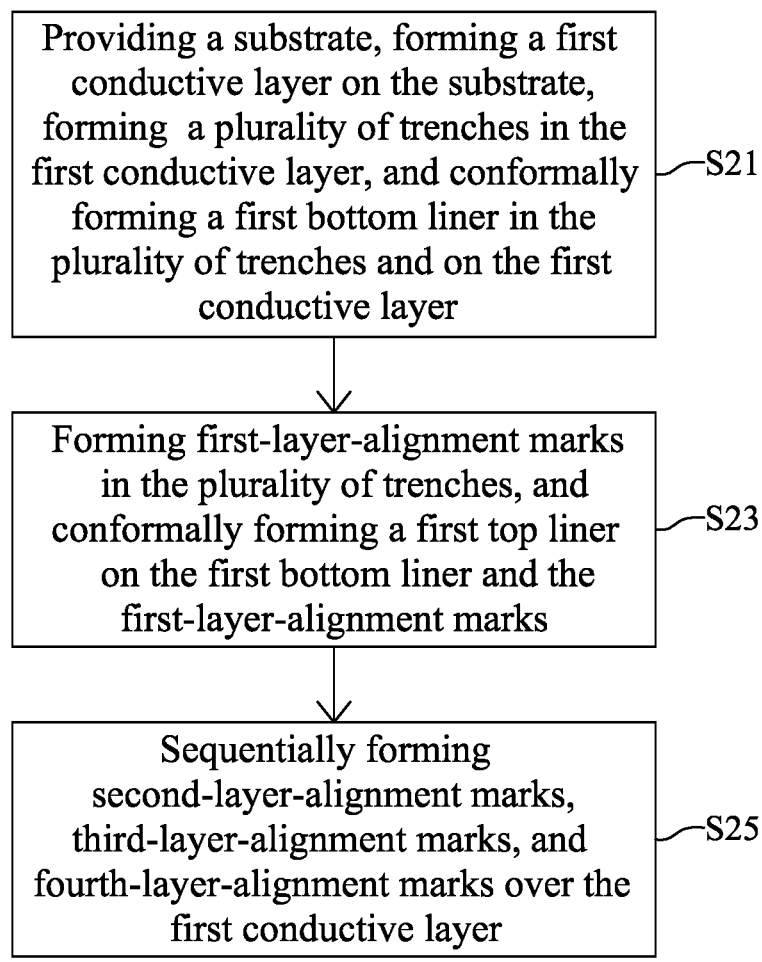
FIG. 23 illustrates, in a flowchart diagram form, a method for fabricating a semiconductor device in accordance with another embodiment of the present disclosure.
Figure 24:
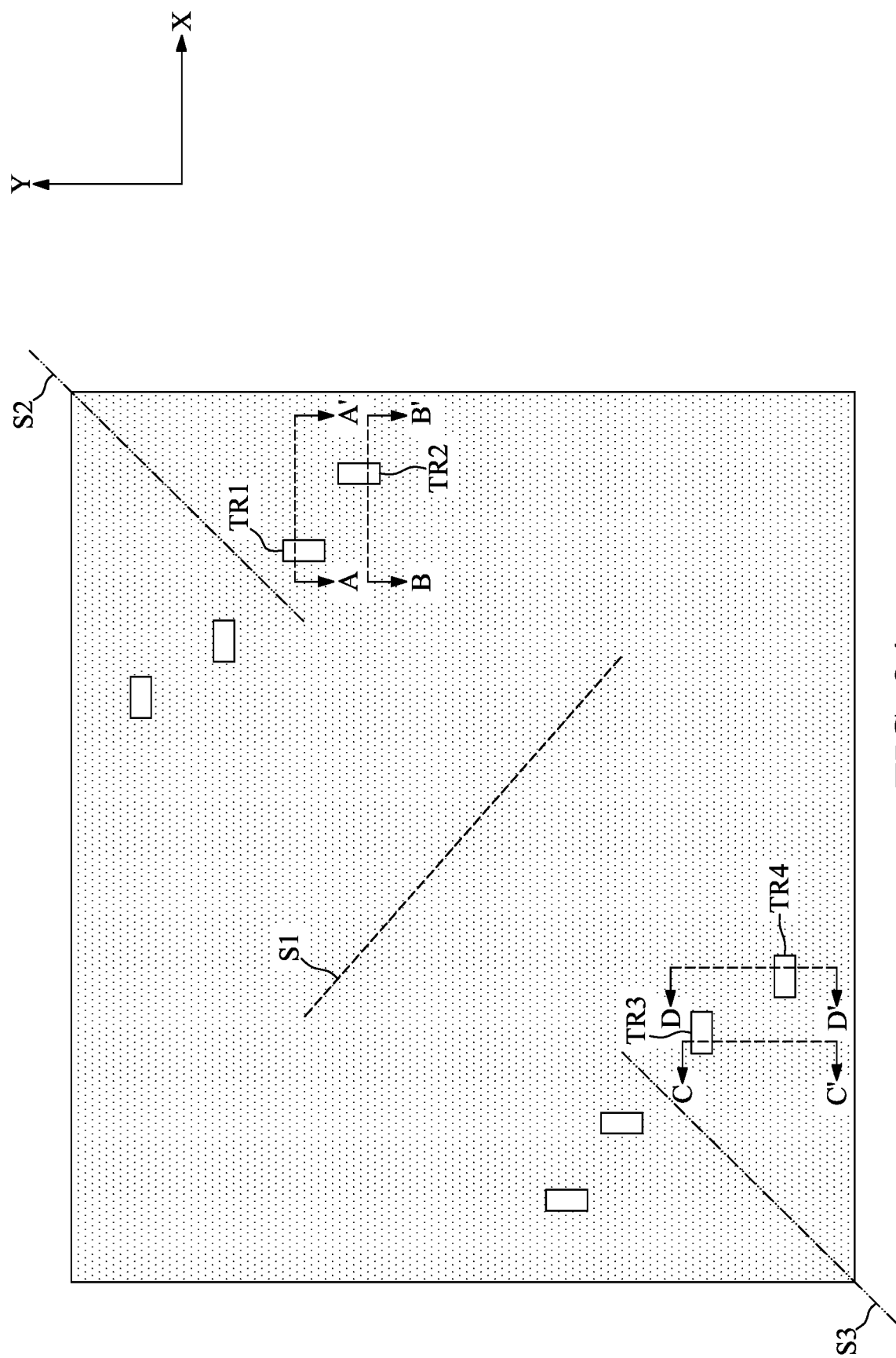
FIG. 24 illustrates, in a schematic top-view diagram, an intermediate semiconductor device in accordance with another embodiment of the present disclosure.
Figure 25:
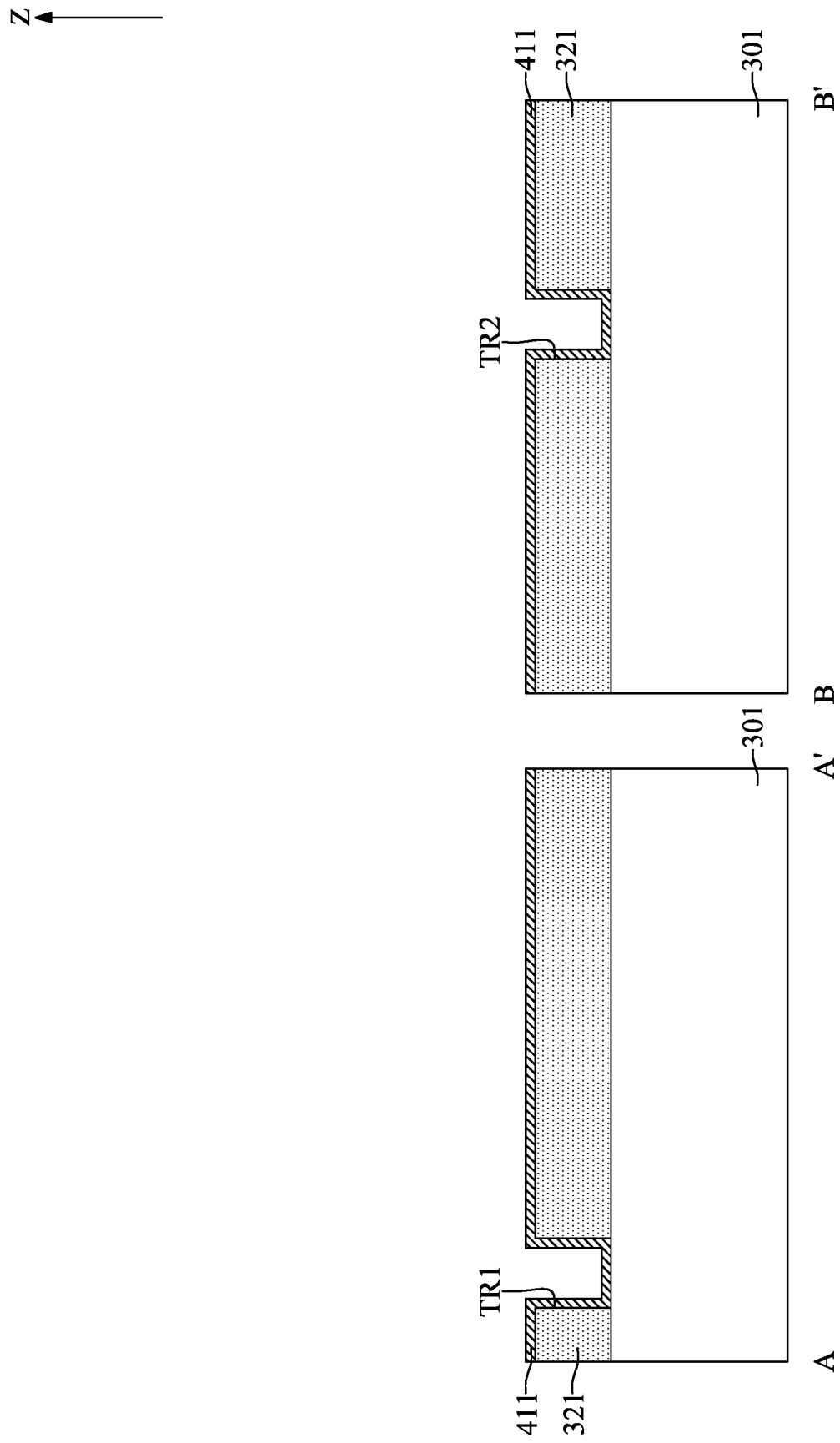
FIGS. 25 and 26 are schematic cross-sectional view diagram taken along lines A-A', B-B', C-C', and D-D' in FIG. 24 illustrating part of the flow for fabricating the semiconductor device in accordance with another embodiment of the present disclosure.
Figure 26:
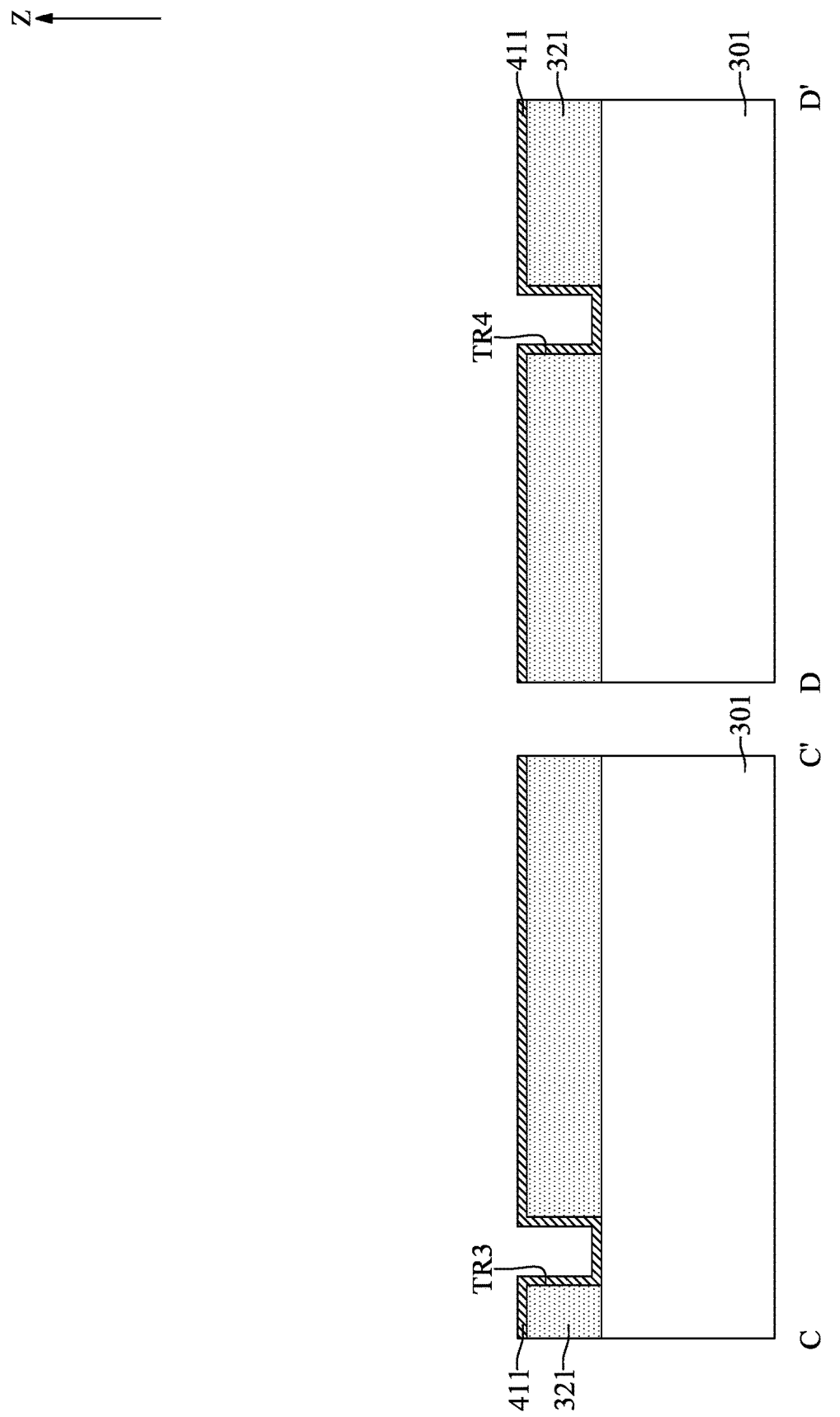

FIG. 23 illustrates, in a flowchart diagram form, a method 20 for fabricating a semiconductor device 1B in accordance with another embodiment of the present disclosure. FIG. 24 illustrates, in a schematic top-view diagram, an intermediate semiconductor device in accordance with another embodiment of the present disclosure. FIG. 25 is a schematic cross-sectional view diagram taken along lines A-A' and B-B' in FIG. 24 illustrating part of the flow for fabricating the semiconductor device 1B in accordance with another embodiment of the present disclosure. FIG. 26 is a schematic cross-sectional view diagram taken along lines C-C' and D-D' in FIG. 24 illustrating part of the flow for fabricating the semiconductor device 1B in accordance with another embodiment of the present disclosure.

With reference to FIGS. 23 to 26, at step S21, a substrate 301 may be provided, a first conductive layer 321 may be formed on the substrate 301, a plurality of trenches TR1, TR2, TR3, TR4 may be formed in the first conductive layer 321, and a first bottom liner 411 may be conformally formed in the plurality of trenches TR1, TR2, TR3, TR4 and on the first conductive layer 321.

With reference to FIGS. 24 to 26, the substrate 301 may be formed with a procedure similar to that illustrated in FIGS. 8 to 10, and descriptions thereof are not repeated herein. A layer of first material (not shown) may be formed on the substrate 301. In some embodiments, the first material may be, for example, tungsten, cobalt, zirconium, tantalum, titanium, aluminum, ruthenium, copper, metal carbides, metal nitrides, transition metal aluminides, or a combination thereof. The layer of first material may be formed by, for example, physical vapor deposition, sputtering, chemical vapor deposition, or other applicable deposition process. Next, the layer of first material may be patterned by a photolithography process and a following etch process to form the plurality of trenches TR1, TR2, TR3, TR4.

With reference to FIGS. 24 to 26, the first top liner 421 may be formed by, for example an atomic layer deposition. Generally, an atomic layer deposition alternately supplies two (or more) different source gases one by one onto a process object (e.g., the first conductive layer 321 and the plurality of trenches TR1, TR2, TR3, TR4) under predetermined process conditions, so that chemical species is adsorbed to the process object at a single atomic layer level, and are deposited on the process object through surface reactions. For instance, first and second source gases are alternately supplied to a process object to flow along the surface thereof, thereby molecules contained in the first source gas adsorb to the surface, and molecules contained in the second source gas react with the adsorbed molecules originated from the first source gas to form a film of a thickness of a single molecule level. The above process steps are performed repeatedly, so that a high-quality film can be formed on the process object.

Figure 27:
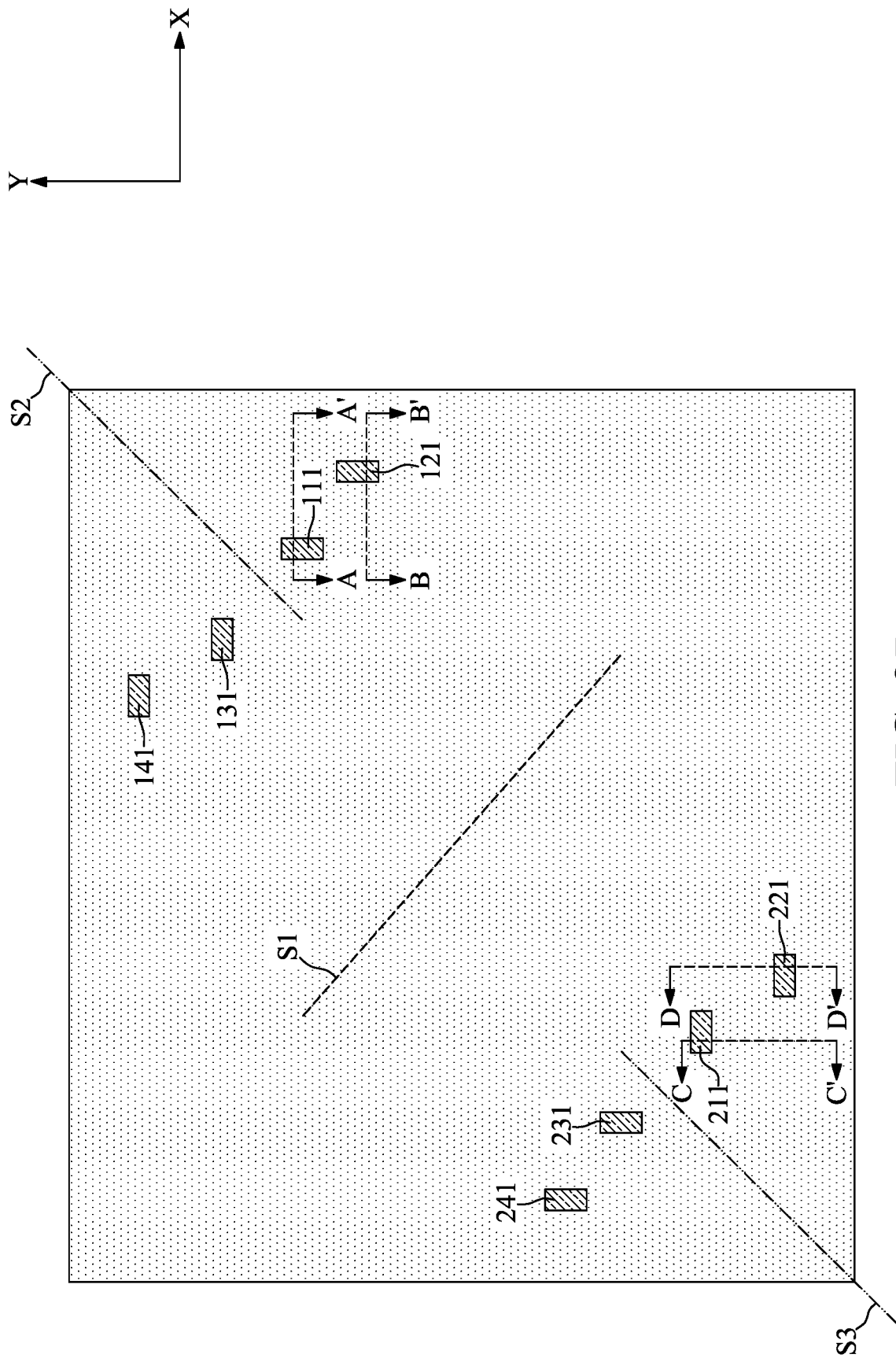
FIG. 27 illustrates, in a schematic top-view diagram, an intermediate semiconductor device in accordance with another embodiment of the present disclosure.
Figure 28:
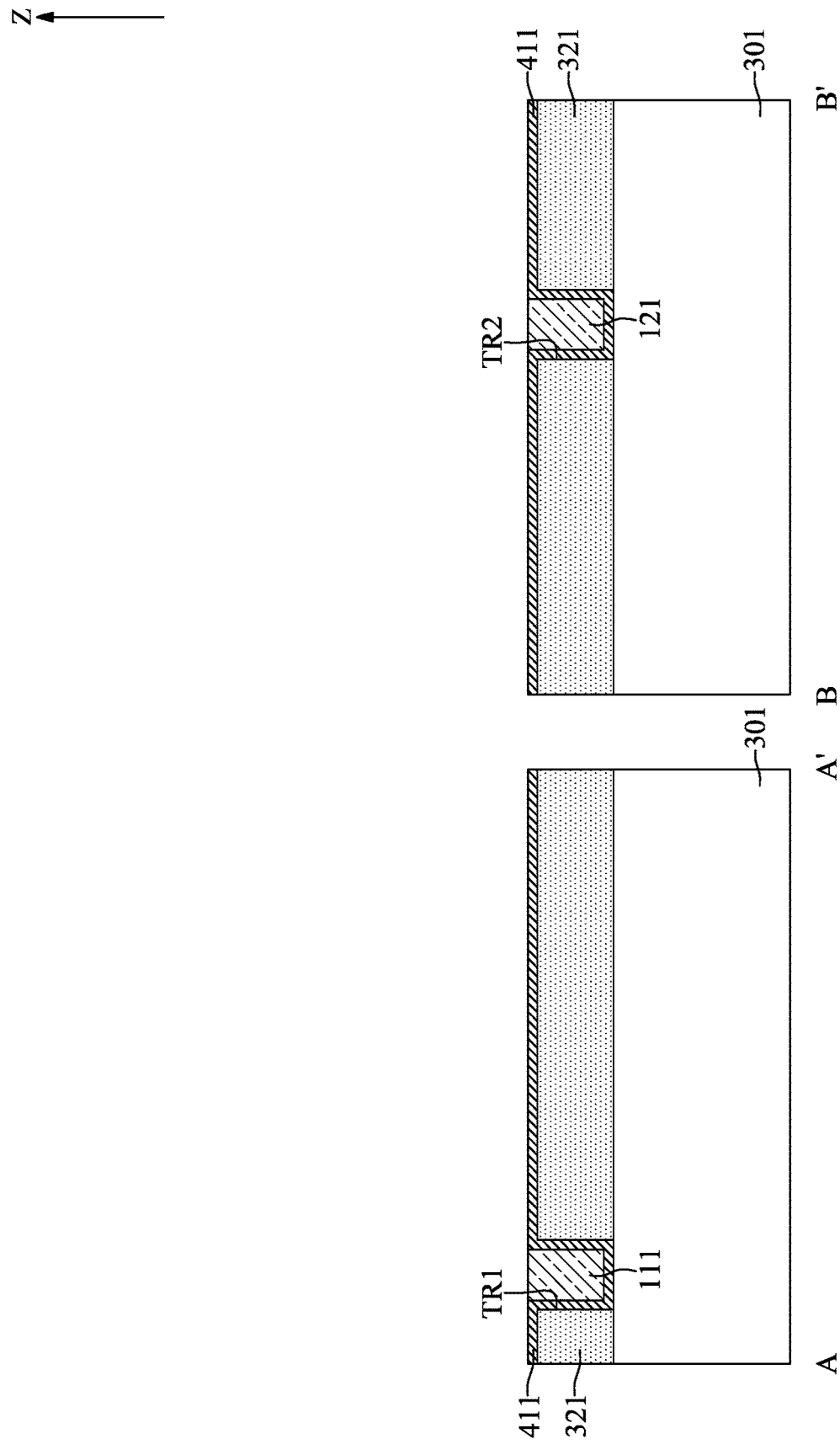
FIGS. 28 to 31 are schematic cross-sectional view diagram taken along lines A-A', B-B', C-C', and D-D' in FIG. 27 illustrating part of the flow for fabricating the semiconductor device in accordance with another embodiment of the present disclosure.
Figure 29:
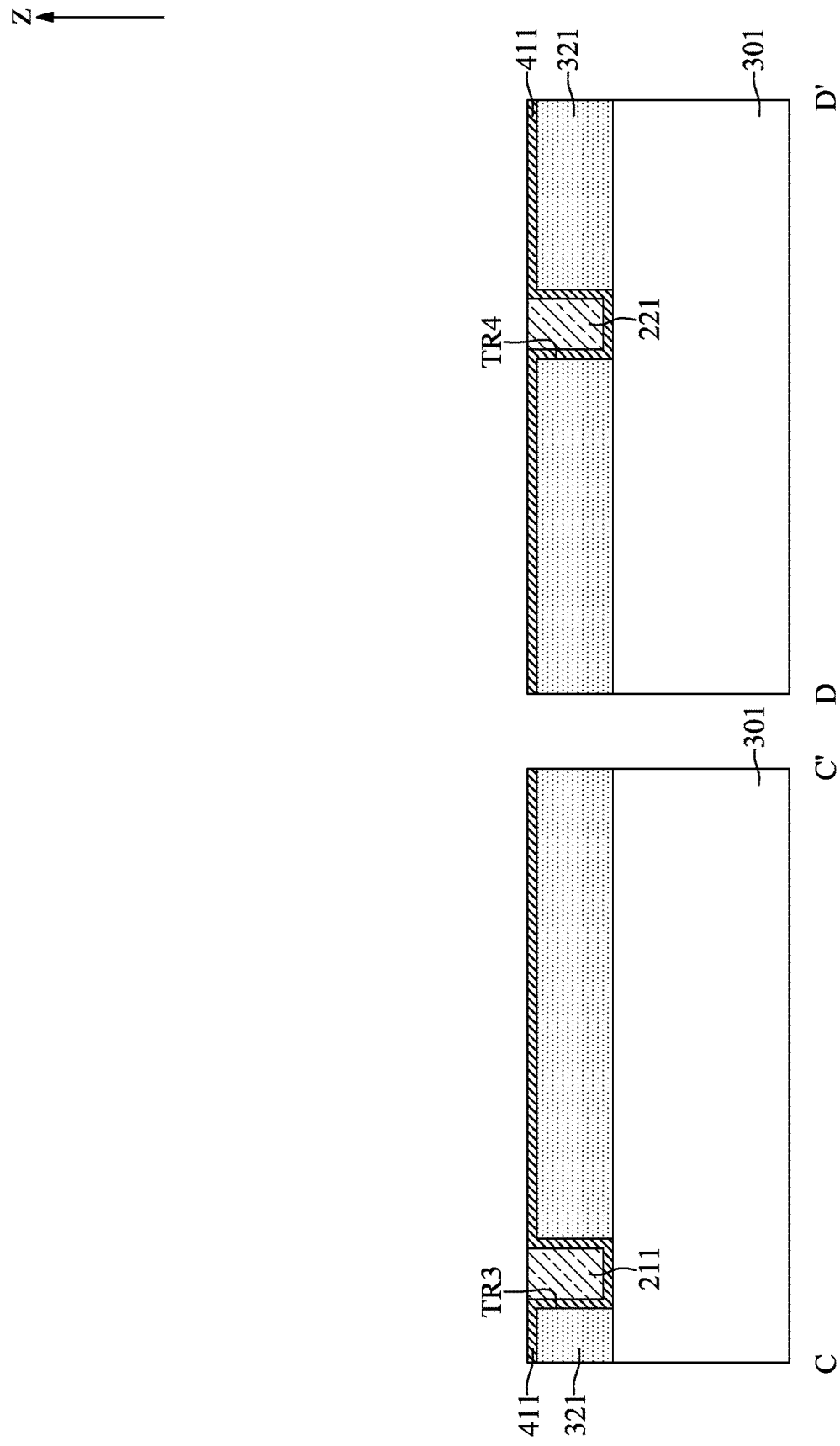
Figure 30:
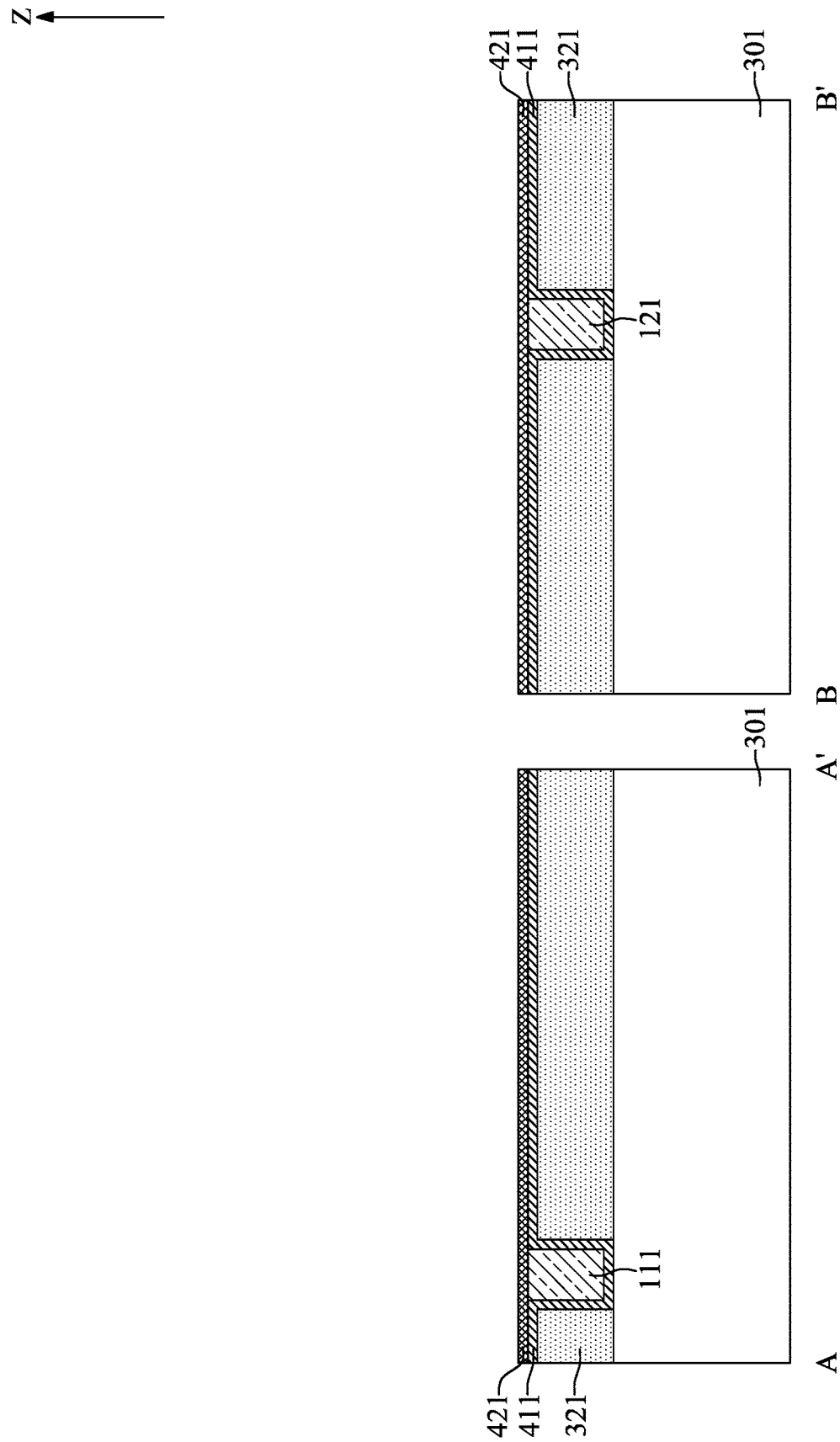
Figure 31:
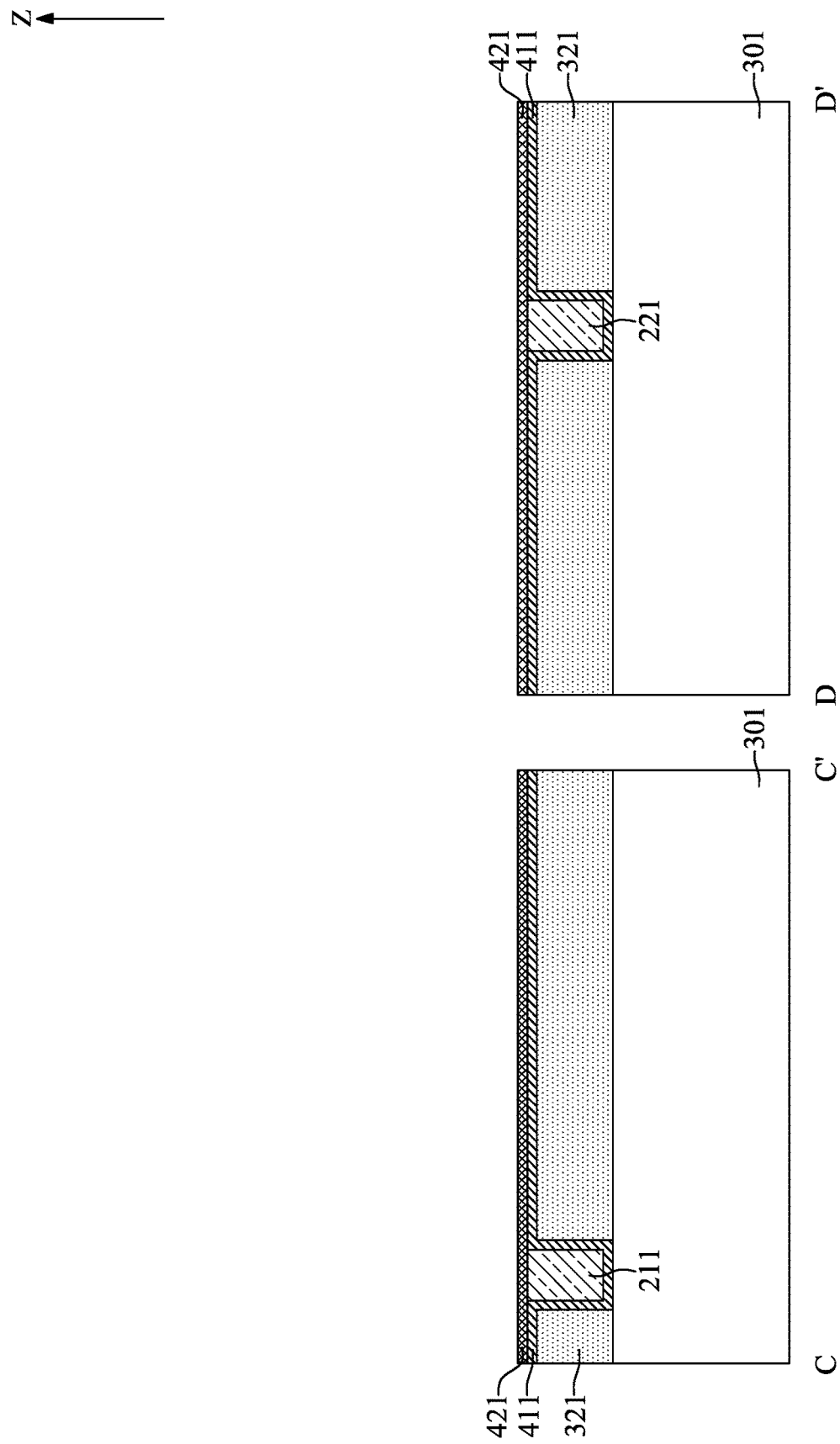

FIG. 27 illustrates, in a schematic top-view diagram, an intermediate semiconductor device in accordance with another embodiment of the present disclosure. FIG. 28 is a schematic cross-sectional view diagram taken along lines A-A' and B-B' in FIG. 27 illustrating part of the flow for fabricating the semiconductor device 1B in accordance with another embodiment of the present disclosure. FIG. 29 is a schematic cross-sectional view diagram taken along lines C-C' and D-D' in FIG. 27 illustrating part of the flow for fabricating the semiconductor device 1B in accordance with another embodiment of the present disclosure. FIG. 30 is a schematic cross-sectional view diagram taken along lines A-A' and B-B' in FIG. 27 illustrating part of the flow for fabricating the semiconductor device 1B in accordance with another embodiment of the present disclosure. FIG. 31 is a schematic cross-sectional view diagram taken along lines C-C' and D-D' in FIG. 27 illustrating part of the flow for fabricating the semiconductor device 1B in accordance with another embodiment of the present disclosure.

With reference to FIG. 23 and FIGS. 27 to 31, at step S23, first-layer-alignment marks 111, 121, 131, 141, 211, 221, 231, 241 may be formed in the plurality of trenches TR1, TR2, TR3, TR4, and a first top liner 421 may be conformally formed on the first bottom liner 411 and the first-layer-alignment marks 111, 121, 131, 141, 211, 221, 231, 241.

With reference to FIGS. 27 to 29, the first-layer-alignment marks 111, 121, 131, 141, 211, 221, 231, 241 may be formed in the plurality of trenches TR1, TR2, TR3, TR4 and on the first bottom liner 411 with a procedure similar to that illustrated in FIGS. 11 to 13, and descriptions thereof are not repeated herein.

With reference to FIGS. 30 and 31, the first top liner 421 may be formed by, for example, atomic layer deposition with a procedure similar to the first bottom liner 411, and descriptions thereof are not repeated herein.

Figure 32:
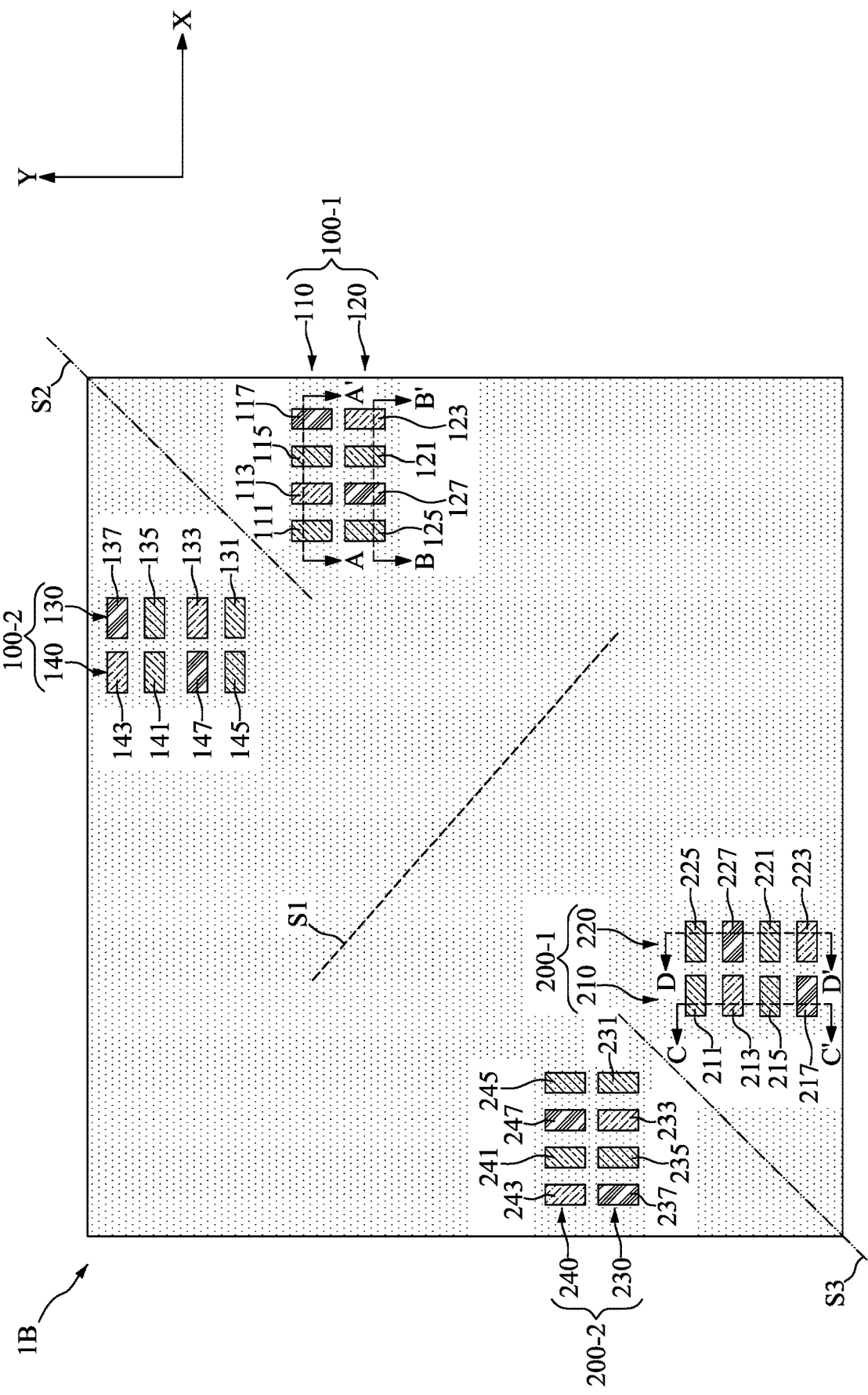
FIG. 32 illustrates, in a schematic top-view diagram, an intermediate semiconductor device in accordance with another embodiment of the present disclosure.
Figure 33:
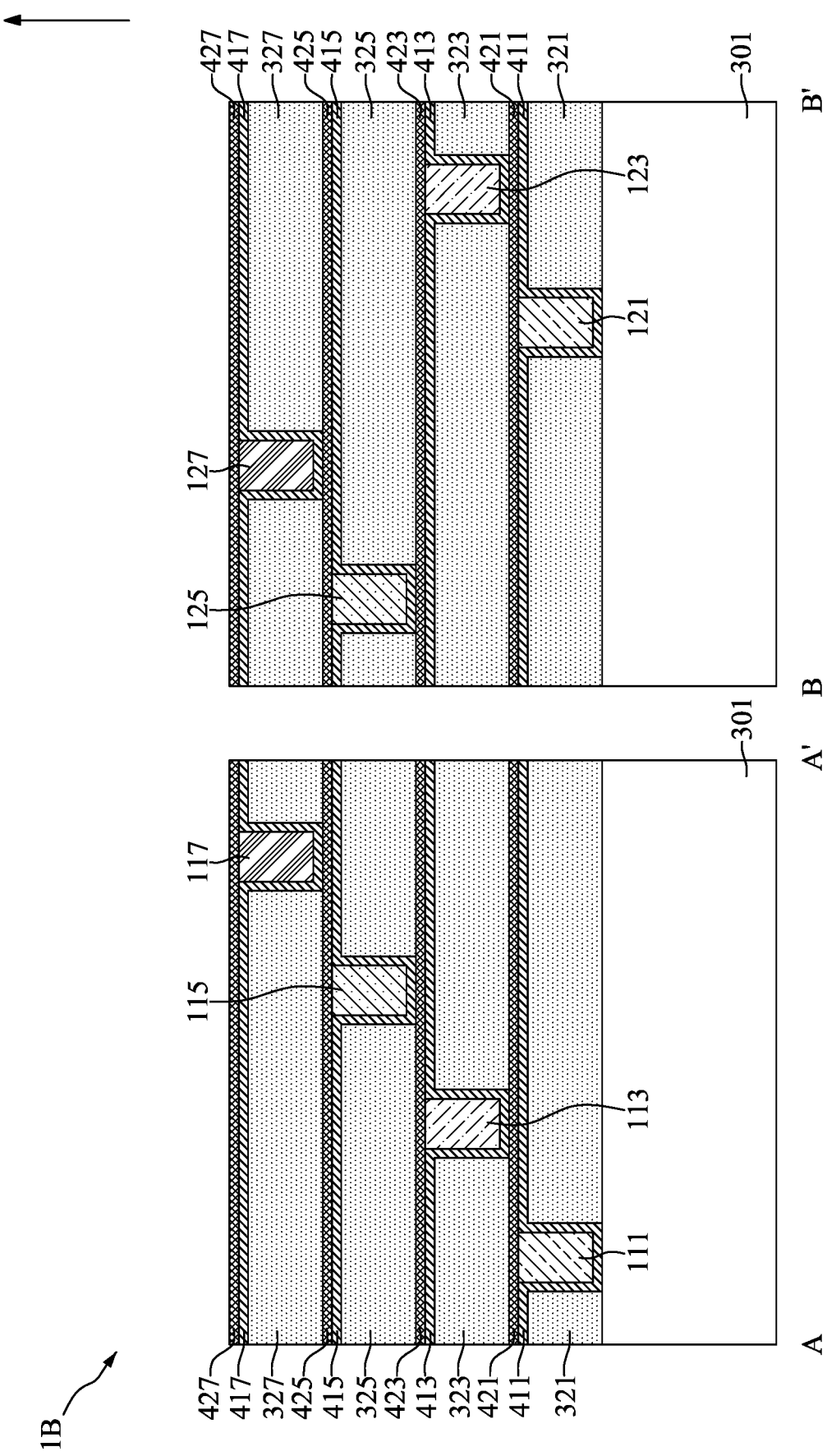
FIGS. 33 and 34 are schematic cross-sectional view diagrams taken along lines A-A', B-B', C-C', and D-D' in FIG. 32 illustrating part of the flow for fabricating the semiconductor device in accordance with another embodiment of the present disclosure.
Figure 34:
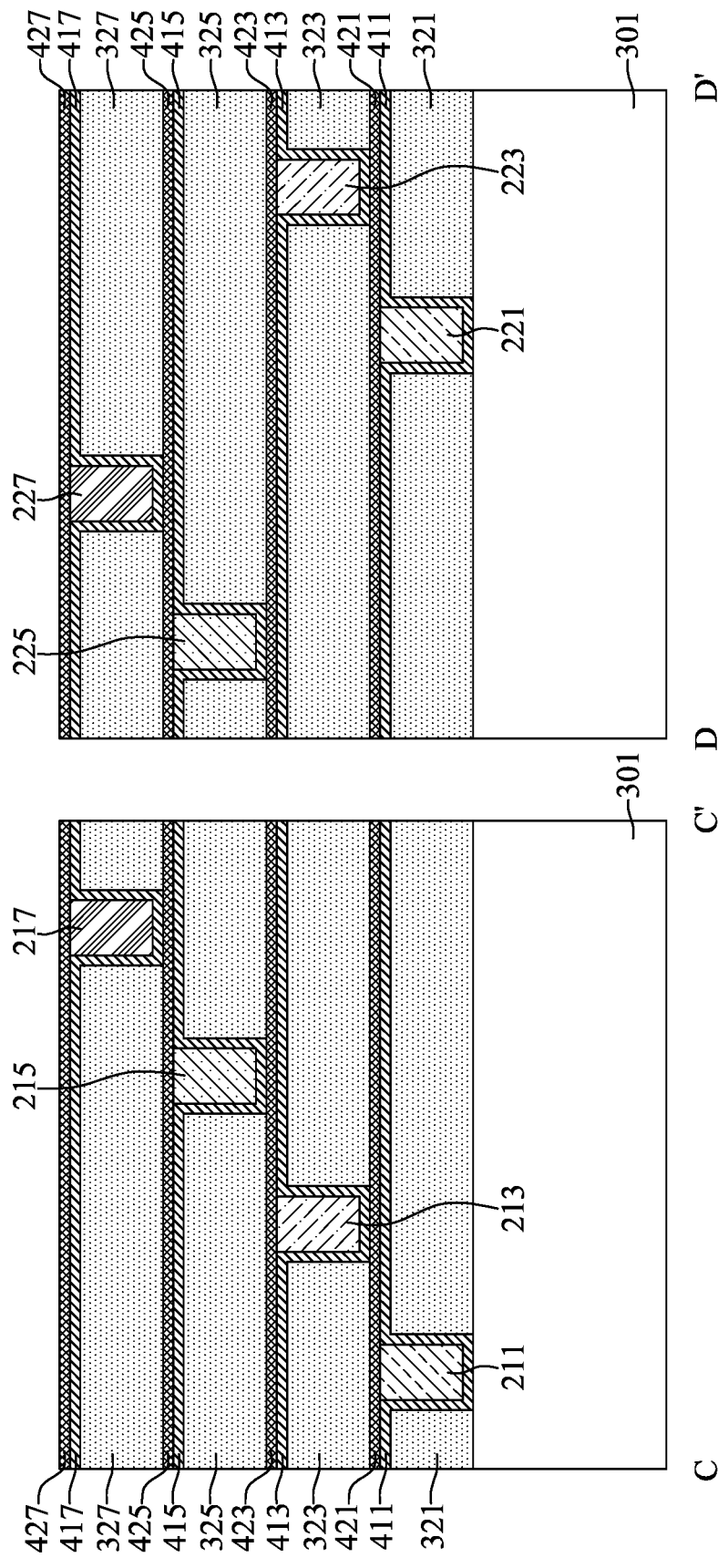

FIG. 32 illustrates, in a schematic top-view diagram, an intermediate semiconductor device in accordance with another embodiment of the present disclosure. FIG. 33 is a schematic cross-sectional view diagram taken along lines A-A' and B-B' in FIG. 32 illustrating part of the flow for fabricating the semiconductor device 1B in accordance with another embodiment of the present disclosure. FIG. 34 is a schematic cross-sectional view diagram taken along lines C-C' and D-D' in FIG. 32 illustrating part of the flow for fabricating the semiconductor device 1B in accordance with another embodiment of the present disclosure.

With reference to FIG. 23 and FIGS. 32 to 34, at step S25, second-layer-alignment marks 113, 123, 133, 143, 213, 223, 233, 243, third-layer-alignment marks 115, 125, 135, 145, 215, 225, 235, 245, and fourth-layer-alignment marks 117, 127, 137, 147, 217, 227, 237, 247 may be sequentially formed over the first conductive layer 321.

With reference to FIGS. 32 to 34, a second conductive layer 323 may be formed on the first conductive layer 321, a plurality of trenches (not shown) may be formed in the second conductive layer 323, a second bottom liner 413 may be conformally formed on the second conductive layer 323 and in the plurality of trenches, the second-layer-alignment marks 113, 123, 133, 143, 213, 223, 233, 243 may be formed in the plurality of trenches, and a second top liner 423 may be conformally formed on the second bottom liner 413 and on the second-layer-alignment marks 113, 123, 133, 143, 213, 223, 233, 243 with a procedure similar to that illustrated in FIGS. 24 to 31, and descriptions thereof are not repeated herein.

Similarly, the third conductive layer 325, the third bottom liner 415, the third-layer-alignment marks 115, 125, 135, 145, 215, 225, 235, 245, and the third top liner 425 may be formed with a procedure similar to that illustrated in FIGS. 24 to 31, and descriptions thereof are not repeated herein.

Similarly, the fourth conductive layer 327, the fourth bottom liner 417, the fourth-layer-alignment marks 117, 127, 137, 147, 217, 227, 237, 247, and the fourth top liner 427 may be formed with a procedure similar to that illustrated in FIGS. 24 to 31, and descriptions thereof are not repeated herein.

One aspect of the present disclosure provides a semiconductor device including a first subset of solid alignment marks positioned over a substrate and including: a first-layer-alignment mark of the first subset of solid alignment marks positioned on the substrate, and a second-layer-alignment mark of the first subset of solid alignment marks positioned above and deviated from the first-layer-alignment mark of the first subset of solid alignment marks; and a first subset of spaced alignment marks positioned over the substrate, distant from the first subset of solid alignment marks, and including: a first-layer-alignment mark of the first subset of spaced alignment marks positioned on the substrate and distant from the first-layer-alignment mark of the first subset of solid alignment marks, and a second-layer-alignment mark of the first subset of spaced alignment marks positioned above and deviated from the first-layer-alignment mark of the first subset of spaced alignment marks. The first subset of solid alignment marks and the first subset of spaced alignment marks include a fluorescence material.

Another aspect of the present disclosure provides a semiconductor device including a first conductive layer positioned on a substrate and a second conductive layer positioned on the first insulating layer; a first subset of solid alignment marks including: a first-layer-alignment mark of the first subset of solid alignment marks positioned in the first conductive layer, and a second-layer-alignment mark of the first subset of solid alignment marks positioned in the second conductive layer and deviated from the first-layer-alignment mark of the first subset of solid alignment marks; and a first subset of spaced alignment marks including: a first-layer-alignment mark of the first subset of spaced alignment marks positioned in the first conductive layer and distant from the first-layer-alignment mark of the first subset of solid alignment marks, a second-layer-alignment mark of the first subset of spaced alignment marks positioned in the second conductive layer and deviated from the first-layer-alignment mark of the first subset of spaced alignment marks. The first subset of solid alignment marks and the first subset of spaced alignment marks include a fluorescence material.

Another aspect of the present disclosure provides a method for fabricating a semiconductor device including providing a substrate; and forming a first subset of solid alignment marks and a first subset of spaced alignment marks over the substrate and distant from each other. The first subset of solid alignment marks includes a first-layer-alignment mark of the first subset of solid alignment marks formed on the substrate, and a second-layer-alignment mark of the first subset of solid alignment marks formed above and deviated from the first-layer-alignment mark of the first subset of solid alignment marks. The first subset of spaced alignment marks includes a first-layer-alignment mark of the first subset of spaced alignment marks formed on the substrate and distant from the first-layer-alignment mark of the first subset of solid alignment marks, and a second-layer-alignment mark of the first subset of spaced alignment marks formed above and deviated from the first-layer-alignment mark of the first subset of spaced alignment marks. The first subset of solid alignment marks and the first subset of spaced alignment marks include a fluorescence material.

Due to the design of the semiconductor device of the present disclosure, the alignment marks 111, 113, 115, 117, 121, 123, 125, 127, 131, 133, 135, 137, 141, 143, 145, 147, 211, 213, 215, 217, 221, 223, 225, 227, 231, 233, 235, 237, 241, 243, 245, 247 including the fluorescence material may improve optical recognition during wafer fabricating process. As a result, the yield of fabricating the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
    a first subset of solid alignment marks positioned over a substrate and comprising:
        a first-layer-alignment mark of the first subset of solid alignment marks positioned on the substrate; and
        a second-layer-alignment mark of the first subset of solid alignment marks positioned above and deviated from the first-layer-alignment mark of the first subset of solid alignment marks; and
    a first subset of spaced alignment marks positioned over the substrate, distant from the first subset of solid alignment marks, and comprising:
        a first-layer-alignment mark of the first subset of spaced alignment marks positioned on the substrate and distant from the first-layer-alignment mark of the first subset of solid alignment marks; and
        a second-layer-alignment mark of the first subset of spaced alignment marks positioned above and deviated from the first-layer-alignment mark of the first subset of spaced alignment marks;
    wherein the first subset of solid alignment marks and the first subset of spaced alignment marks comprise a fluorescence material.

2. The semiconductor device of claim 1, wherein the fluorescence material comprises azobenzene.

3. The semiconductor device of claim 2, wherein the first-layer-alignment mark of the first subset of solid alignment marks and the second-layer-alignment mark of the first subset of solid alignment marks are line shaped, respectively extending along a first direction, separated from each other along a second direction perpendicular to the first direction.

4. The semiconductor device of claim 3, wherein the first-layer-alignment mark of the first subset of solid alignment marks and the first-layer-alignment mark of the first subset of spaced alignment marks are positioned in a mirror manner according to a first axis of symmetry, the second-layer-alignment mark of the first subset of solid alignment marks and the second-layer-alignment mark of the first subset of spaced alignment marks are positioned in a mirror manner according to the first axis of symmetry, and the first axis of symmetry is extending along a direction slanted with respective to the first direction and the second direction.

5. The semiconductor device of claim 4, further comprising:
    a first insulating layer positioned on the substrate, wherein the first-layer-alignment mark of the first subset of solid alignment marks is positioned in the first insulating layer; and
    a second insulating layer positioned on the first insulating layer, wherein the second-layer-alignment mark of the first subset of solid alignment marks is positioned in the second insulating layer.

6. The semiconductor device of claim 5, wherein the first subset of solid alignment marks comprises:
    a third-layer-alignment mark of the first subset of solid alignment marks positioned above and deviated from the second-layer-alignment mark of the first subset of solid alignment marks;
    a fourth-layer-alignment mark of the first subset of solid alignment marks positioned above and deviated from the third-layer-alignment mark of the first subset of solid alignment marks;

wherein the third-layer-alignment mark of the first subset of solid alignment marks is positioned between the second-layer-alignment mark of the first subset of solid alignment marks and the fourth-layer-alignment mark of the first subset of solid alignment marks in the top-view perspective.

7. The semiconductor device of claim 6, further comprising a second subset of solid alignment marks comprising:
   a first-layer-alignment mark of the second subset of solid alignment marks positioned in the first insulating layer, aligned with the third-layer-alignment mark of the first subset of solid alignment marks along the second direction, and distant from the third-layer-alignment mark of the first subset of solid alignment marks along the first direction;
   a second-layer-alignment mark of the second subset of solid alignment marks positioned in the second insulating layer, aligned with the fourth-layer-alignment mark of the first subset of solid alignment marks along the second direction, and distant from the fourth-layer-alignment mark of the first subset of solid alignment marks along the first direction.

8. The semiconductor device of claim 7, wherein a length of the first-layer-alignment mark of the first subset of solid alignment marks and a distance between the third-layer-alignment mark of the first subset of solid alignment marks and the first-layer-alignment mark of the second subset of solid alignment marks are substantially the same.

9. The semiconductor device of claim 7, wherein a length of the first-layer-alignment mark of the first subset of solid alignment marks and a distance between the third-layer-alignment mark of the first subset of solid alignment marks and the first-layer-alignment mark of the second subset of solid alignment marks are different.

10. The semiconductor device of claim 6, further comprising a third subset of solid alignment marks comprising:
    a first-layer-alignment mark of the third subset of solid alignment marks positioned in the first insulating layer and separated from the first-layer-alignment mark of the first subset of solid alignment marks; and
    a second-layer-alignment mark of the third subset of solid alignment marks positioned in the second insulating layer and separated from the first-layer-alignment mark of the third subset of solid alignment marks along the first direction.

11. The semiconductor device of claim 10, wherein the first-layer-alignment mark of the third subset of solid alignment marks and the first-layer-alignment mark of the first subset of solid alignment marks are positioned in a mirror manner according to a second axis of symmetry, the second-layer-alignment mark of the third subset of solid alignment marks and the second-layer-alignment mark of the first subset of solid alignment marks are positioned in a mirror manner according to the second axis of symmetry, and the second axis of symmetry is perpendicular to the first axis of symmetry.

12. The semiconductor device of claim 11, wherein a width of the first-layer-alignment mark of the first subset of solid alignment marks and a width of the second-layer-alignment mark of the first subset of solid alignment marks are substantially the same.

13. The semiconductor device of claim 11, wherein a width of the first-layer-alignment mark of the first subset of solid alignment marks and a width of the second-layer-alignment mark of the first subset of solid alignment marks are different.

14. The semiconductor device of claim 11, wherein a width of the first-layer-alignment mark of the first subset of solid alignment marks and a distance between the first-layer-alignment mark of the first subset of solid alignment marks and the second-layer-alignment mark of the first subset of solid alignment marks are substantially the same.

15. The semiconductor device of claim 11, wherein a width of the first-layer-alignment mark of the first subset of solid alignment marks and a distance between the first-layer-alignment mark of the first subset of solid alignment marks and the second-layer-alignment mark of the first subset of solid alignment marks are different.

16. The semiconductor device of claim 11, wherein a length of the first-layer-alignment mark of the first subset of solid alignment marks and a length of the second-layer-alignment mark of the first subset of solid alignment marks are substantially the same.

17. The semiconductor device of claim 11, wherein a length of the first-layer-alignment mark of the first subset of solid alignment marks and a length of the second-layer-alignment mark of the first subset of solid alignment marks are different.

* * * * *